(12) United States Patent
Ho et al.

(10) Patent No.: US 7,755,945 B2
(45) Date of Patent: Jul. 13, 2010

(54) PAGE BUFFER AND METHOD OF PROGRAMMING AND READING A MEMORY

(75) Inventors: Wen-Chiao Ho, Tainan County (TW);
Chin-Hung Chang, Tainan (TW);
Kuen-Long Chang, Taipei (TW);
Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 190 days.

(21) Appl. No.: 12/182,245

(22) Filed: Jul. 30, 2008

(65) Prior Publication Data

US 2010/0027339 A1    Feb. 4, 2010

(51) Int. Cl.
*G11C 16/04* (2006.01)
(52) U.S. Cl. ............... 365/185.12; 365/185.05; 365/185.18
(58) Field of Classification Search .......... 365/185.12, 365/185.05, 185.18
See application file for complete search history.

(56) References Cited

U.S. PATENT DOCUMENTS 6,850,438 B2 * 2/2005 Lee et al. ............. 365/185.11
7,382,656 B2 * 6/2008 Ho et al. ............. 365/185.22

* cited by examiner

*Primary Examiner*—Pho M Luu
(74) *Attorney, Agent, or Firm*—Thomas, Kayden, Horstemeyer & Risley

(57) ABSTRACT

A page buffer and method of programming and reading a memory are provided. The page buffer includes a first latch, a second latch, a data change unit and a program control unit. The first latch includes a first terminal for loading data of the lower page and the upper page. The second latch includes a first terminal for storing the data of the lower page and the upper page from the first latch. The data change unit is coupled to a second terminal of the first latch for changing a voltage of the second terminal of the first latch to a low level. The program control unit is coupled to the first terminal of the second latch and the cells, and controlled by the voltage of the first terminal of the first latch for respectively programming the data of the lower page and the upper page to a target cell.

30 Claims, 16 Drawing Sheets

PAGE BUFFER AND METHOD OF PROGRAMMING AND READING A MEMORY

BACKGROUND OF THE INVENTION

1. Field of the Invention

The invention relates in general to a page buffer and method of programming and reading a memory, and more particularly to a page buffer, in which a data change unit is used to change the value of the latch for the data of a lower page to have a high level, and method of programming and reading a memory.

2. Description of the Related Art

Multi-Level Cell (MLC) technology enables storage of multiple bits per memory cell by charging the poly-silicon floating gate of a transistor to different levels. This technology takes advantage of the analog nature of a traditional flash cell by assigning a bit pattern to a specific voltage range. MLC effectively reduces cell area as well as the die size for a given density. This ultimately leads to a significantly reduced unit cost-per-megabyte—one of the greatest benefits of this technology.

NAND flash memory in MLC application, capable of storing two bits per memory cell, requires a smaller chip area per cell, thus allowing greater storage densities and lower costs per bit than other flash memory. Therefore, how to design a page buffer circuit for the operation of NAND flash memory in MLC application is very essential for the flash-memory industries.

SUMMARY OF THE INVENTION

The invention is directed to a novel page buffer and method of programming and reading a memory. A data change unit is used to change the value of the latch for data of a lower page to have a high level, and the data of the lower page or upper page can be programmed to a target cell only when the value of the latch has the high level. Therefore, the program and read performance of the memory can be improved.

According to a first aspect of the present invention, a page buffer is provided. The page buffer is applied in a memory, and the memory includes a number of cells. Each cell has a first bit and a second bit respectively coming from a lower page and an upper page. The page buffer includes a first latch, a second latch, a data change unit and a program control unit. The first latch includes a first terminal for loading the data of the lower page and the upper page. The second latch includes a first terminal for storing the data of the lower page and the upper page from the first latch. The data change unit is coupled to a second terminal of the first latch for changing a voltage of the second terminal of the first latch to a low level. The program control unit is coupled to the first terminal of the second latch and the cells, and controlled by the voltage of the first terminal of the first latch for respectively programming the data of the lower page and the upper page to a target cell.

According to a second aspect of the present invention, a method of programming a memory is provided. The memory includes a number of cells, and each cell has a first bit and a second bit respectively coming from a lower page and an upper page. The method comprising steps of inputting data to a first latch and transferring the data to a second latch; determining whether the lower page has been programmed or not; if the lower page has not been programmed and the data stored in the second latch has a low level, changing a voltage of the first latch to a high level; and programming the data of the second latch to a selected cell.

According to a third aspect of the present invention, a method of reading a memory is provided. The memory comprising a number of cells and each cell has a first bit and a second bit respectively coming from a lower page and an upper page. The method comprises steps of reading data from a target cell according to a first read level; storing the read data in a first latch; if the upper page has been programmed and the upper page is to be read, reading the target cell according to a third read level and storing the read data in a second latch, wherein the third read level is larger than the first read level; and performing a data change operation on the first latch, wherein the data of the first latch is changed to have the high level if the data stored in the second latch has the low level; and outputting the data stored in the first latch.

The invention will become apparent from the following detailed description of the preferred but non-limiting embodiments. The following description is made with reference to the accompanying drawings.

DETAILED DESCRIPTION OF THE INVENTION

Figure 1A:
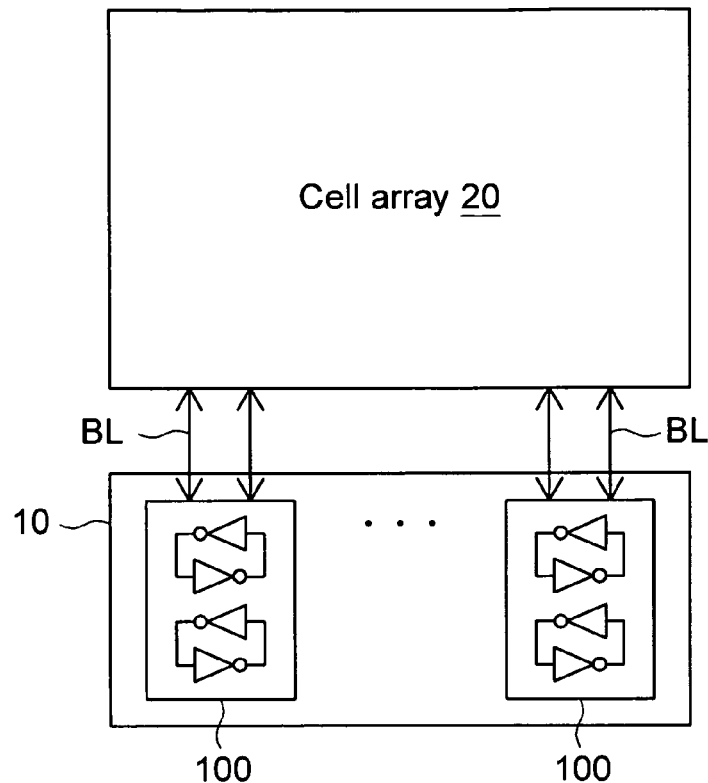
FIG. 1A is a block diagram of a page buffer circuit applied to a memory according to a preferred embodiment of the invention.

Referring to FIG. 1A, a block diagram of a page buffer circuit applied to a memory according to a preferred embodiment of the invention is shown. A page buffer circuit 10, applied to a memory, such as a NAND flash memory in MLC application, includes a number of (e.g. 16K) page buffers 100 coupled to a cell array 20 via bit lines BL. Each page buffer 100 includes a latch-pair for storing 2 bits of data. The cell array 20 includes a number of cells (not shown) and each cell has a first bit (e.g. a left bit) and a second bit (e.g. a right bit) respectively coming from a lower page and an upper page.

Figure 1B:
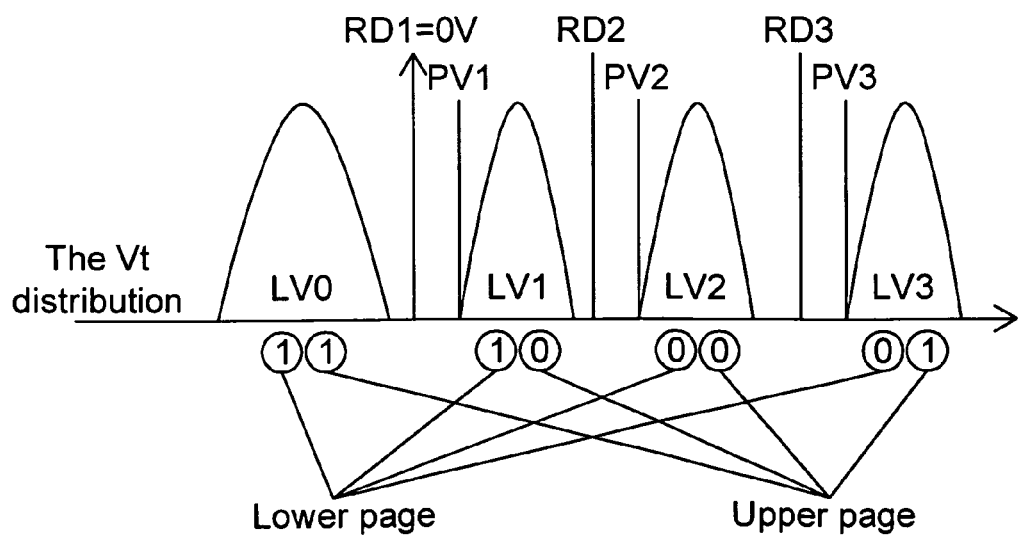
FIG. 1B is a diagram of the Vt definition for the NAND flash memory in MCL application.

Referring to FIG. 1B, a diagram of the Vt definition for the NAND flash memory in MCL application is shown. As shown in FIG. 1B, there are four Vt distributions LV0, LV1, LV2, and LV3 for MLC application. "LV0" is defined as the initial Vt or the erased Vt, in which the Vt values are negative. It means that even a voltage 0V forced on the word-line will have the cell current flow. The program states corresponding to the four Vt distributions from low to high are defined as "11", "10", "00", and "01", in which the left bit comes from the lower page, and the right bit comes from the upper page.

The above MLC Vt definition will also has an advantage that if any retention issue happened to cause some cells to drop or rise the Vt values to the adjacent level, for example, from LV3 drop to LV2, only one bit data is changed. Each cell is programmed to the program state "10", "00", or "01" according to a first program-verify (PV) level PV1, a second PV level PV2 or a third PV level PV3. When a cell is to read, a second read (RD) level RD2 is used to determine the left bit "1" or "0", and a first RD level RD1 (e.g. 0V) or a third RD level RD3 is used to determine the right bit when the left bit is "1" or "0".

Page Buffer Structure

Figure 2:
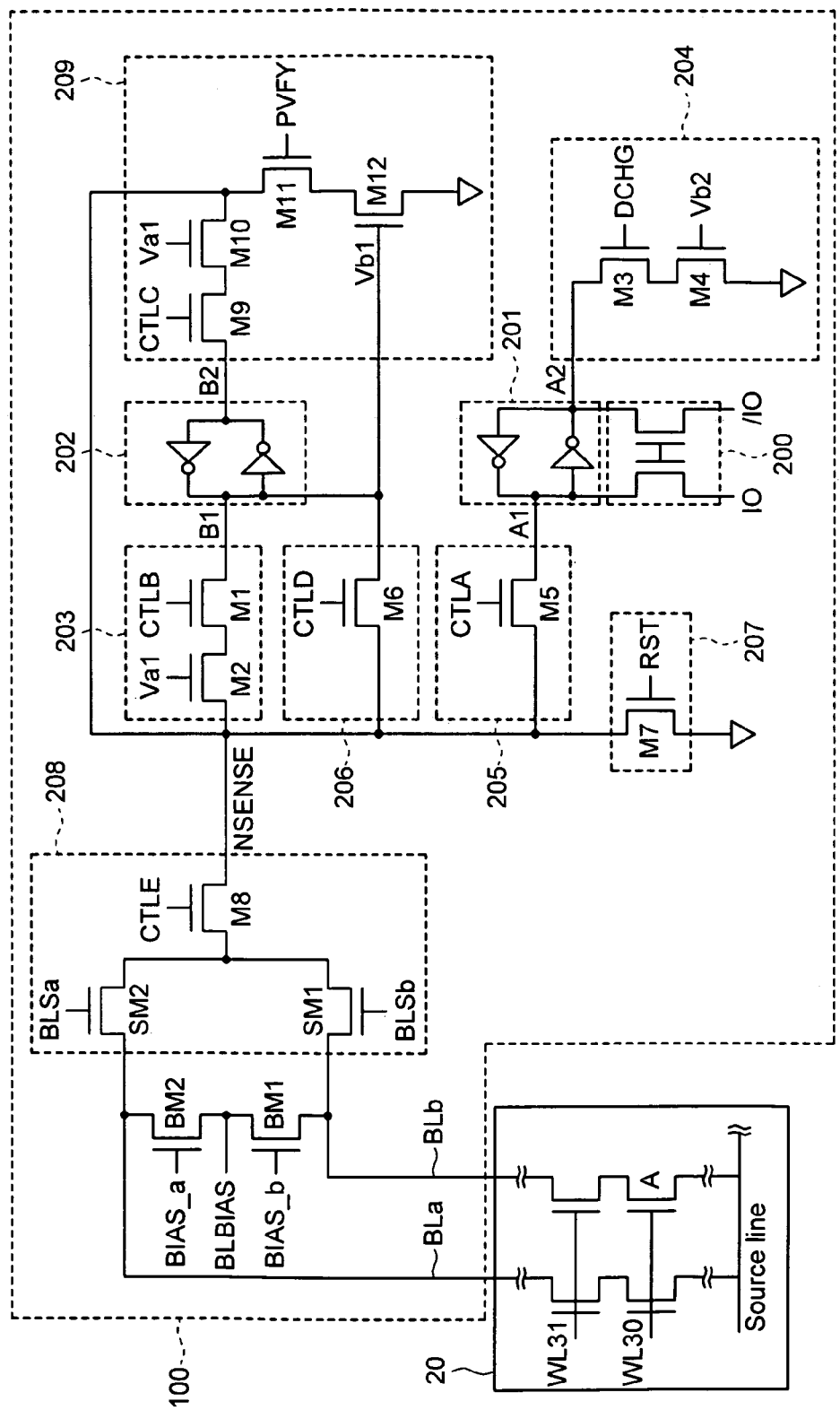
FIG. 2 is a circuit diagram of the page buffer in FIG. 1A.

Referring to FIG. 2, a circuit diagram of the page buffer 100 in FIG. 1A is shown. The page buffer 100 includes a data input unit 200, a first latch 201, a second latch 202, a program control unit 203, a data change unit 204, a fifth switch 205, a sixth switch 206, a seventh switch 207, a selection unit 208 and a program-verify unit 209. The data input unit 200 is for inputting the data of the lower page or the upper page. The first latch 201 includes a first terminal A1 for loading the data of the lower page or the upper page. The second latch 202 includes a first terminal B1 for storing the data of the lower page or the upper page from the first latch 201. Each of the first latch 201 and the second latch 202 includes two inverters reversely coupled to each other in parallel such that a voltage Va1 of the first terminal A1 of the first latch 201 is phase-inverse to a voltage Va2 of the second terminal A2 of the first latch 201 and a voltage Vb1 of the first terminal of the second latch is phase-inverse to a voltage Vb2 of the second terminal B2 of the second latch 202. That is, (Va1, Va2)=("1", "0") or ("0", "1") and (Vb1, Vb2)=("1", "0") or ("0", "1").

The program control unit 203 is coupled to the first terminal B1 of the second latch 202 and the cell array 20 controlled by the voltage Va1 of the first terminal A1 of the first latch 201 for respectively programming the data of the lower page and the upper page from the first terminal B1 of the second latch 202 to the first bit and the second bit of a target cell (e.g. cell A), wherein the program control unit 203 can program the data of the lower page or the upper page to the target cell only when the voltage Va1 of the first terminal A1 of the first latch 201 has a high level VDD (i.e. the value of A1="1") and the voltage Vb1 of the first terminal B1 of the second latch 202 has a low level GND (i.e. the value of B1="0") simultaneously.

The program control unit 203 further includes a first switch, such as an N-type metal oxide semiconductor (NMOS) transistor M1, and a second switch, such as the NMOS transistor M2. The first switch is coupled to the first terminal B1 of the second latch 202. The second switch (M2) includes a first terminal (NSENSE) coupled to the cell array 20, and a second terminal coupled to the first switch (M1), wherein the second switch (M2) is controlled by the voltage Va1 of the first terminal A1 of the first latch 201, and is turned on when the voltage Va1 of the first terminal A1 of the first latch 201 has the high level VDD ("1").

The data change unit 204 is coupled to the second terminal A2 of the first latch 201 for changing the voltage Va1 of the first terminal A1 of the first latch 201 to the high level "1" when both the voltages Va1 and Vb1 of the first terminals A1 and B1 of the first latch 201 and the second latch 202 have a low level (e.g. 0V) ("0").

The data change unit 204 further includes a third switch, such as a NMOS transistor M3, coupled to the second terminal A2 of the first latch 201, and a fourth switch, such as a NMOS transistor M4, coupled between the third switch (M3) and a ground voltage, and controlled by the voltage Vb2 of the second terminal B2 of the second latch 202.

The fifth switch 205, such as a NMOS transistor M5, is coupled between the first terminal (NSENSE) of the second switch (M2) and the first terminal A1 of the first latch 201. The sixth switch 206, such as a NMOS transistor M6, is coupled between the first terminal (NSENSE) of the second switch (M2) and the first terminal B1 of the second latch 202. The fifth switch 205 and the sixth switch 206 are for passing the data of the lower page and the upper page from the first latch 201 to the second latch 202.

The seventh switch 207, such as a NMOS transistor M7, is coupled between the first terminal (NSENSE) of the second switch (M2) and the ground voltage. The selection unit 208 includes an eighth switch, such as a NMOS transistor M8, coupled to the first terminal (NSENSE) of the second switch (M2), and a first select switch and a second select switch, such as NMOS transistors SM1 and SM2, coupled to the eighth switch (M8) for respectively selecting a first bit line BLb and a second bit line BLa coupled to the cell array 20, wherein the first bit line BLb is coupled to the target cell A. The page buffer 100 further includes NMOS transistors BM1 and BM2 for respectively biasing the bit lines BLb and BLa by a voltage BLBIAS.

The program-verify unit 209 includes a ninth switch, a tenth switch, an eleven switch and a twelfth switch. The ninth switch, such as a NMOS transistor M9, is coupled to the second terminal B2 of the second latch 202. The tenth switch, such as a NMOS transistor M10, is coupled to the ninth switch (M9) and controlled by the voltage Va1 of the first terminal A1 of the first latch 201. The eleventh switch, such as a NMOS transistor M11, is coupled to the tenth switch (M10) and the first terminal (NSENSE) of the second switch (M2). The twelfth switch, such as a NMOS transistor M12, is coupled between the eleventh switch (M11) and the ground voltage, and controlled by the voltage Vb1 of the first terminal B1 of the second latch 202.

Data Input

Figure 3:
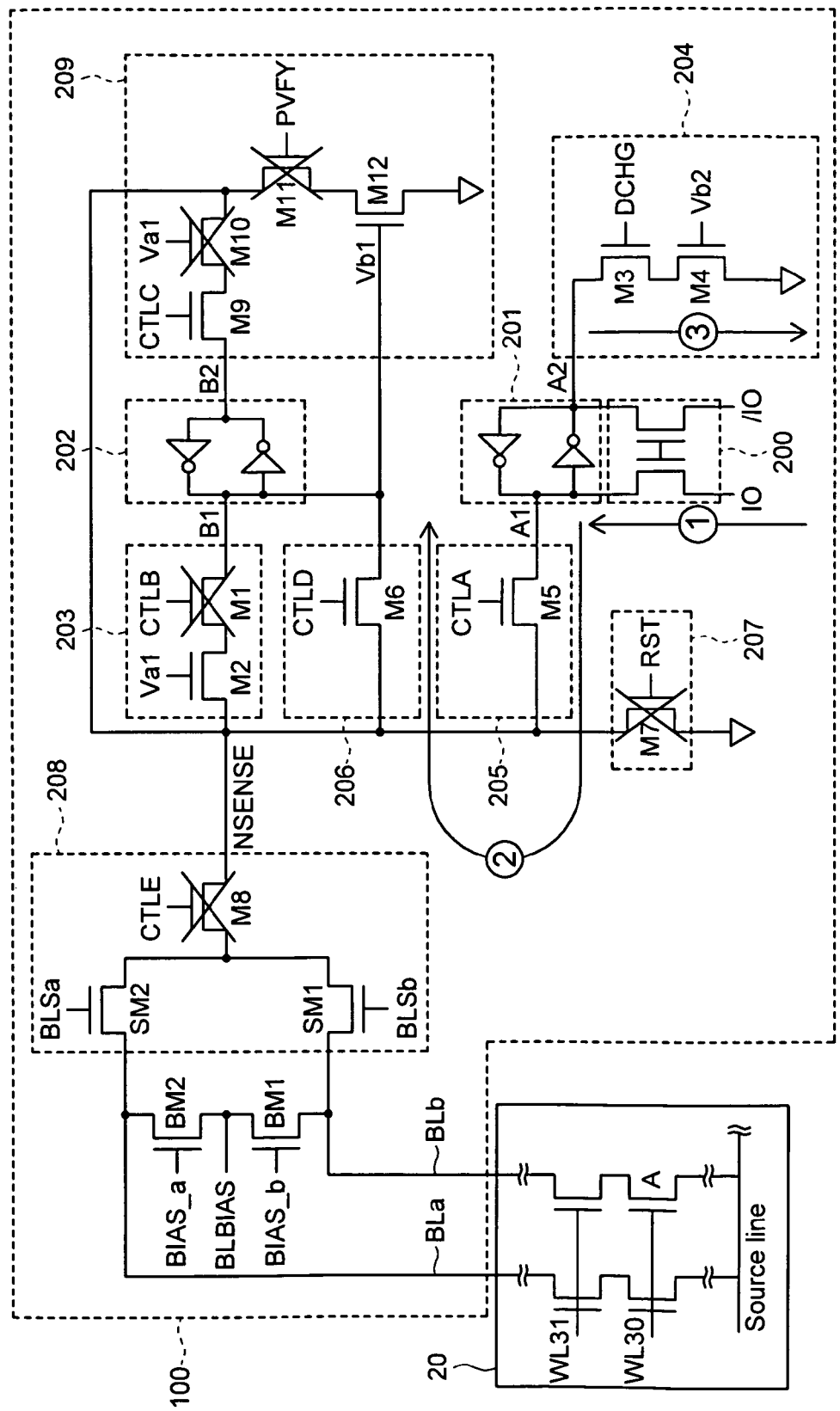
FIG. 3 is a circuit diagram of a data input operation of the page buffer in FIG. 2.

Referring to FIG. 3, a circuit diagram of a data input operation of the page buffer 100 in FIG. 2 is shown. The data of the lower page or the upper page is inputted from the data input unit 200 to the first terminal A1 of the first latch 201 as shown by the path 1, and then loaded from the first terminal A1 of the first latch 201 to the first terminal B1 of the second latch 202 via the fifth switch (M5) and the sixth switch (M6) as shown by the path 2. During the operation of inputting data from the first latch 201 to the second latch 202, the first switch (M1), the seventh switch (M7), the eighth switch (M8), the ninth switch (M9) and the eleventh switch (M11) are turned off respectively by control signals CTLB, RST, CTLE, CTLC and PVFY (with the low level), meanwhile the fifth switch 205 (M5) and the sixth switch 206 (M6) are turned on by control signals CTLA and CTLD (with the high level), respectively.

After the data of the lower page is inputted to the first terminal B1 of the second latch 202, the third switch (M3) is turned on by a control signal DCHG (with the high level). When the data of the lower page inputted to the second latch 202 has the low level "0", and the fourth switch (M4) is also turned on by the voltage Vb2 (="1") of the second terminal B2 of the second latch 202 to ground the voltage Va2 of the second terminal A2 of the first latch 201, as shown by the path 3, and change the voltage Va1 of the first terminal A1 of the first latch 201 to have the high level "1". On the contrary, when the data of the lower page inputted to the second latch 202 has the high level "1", the fourth switch (M4) is turned off by the voltage Vb2 of the second terminal B2 of the second latch 202 such that the voltage Va1 of the first terminal A1 of the first latch 201 is kept at the high level "1".

Figure 4:
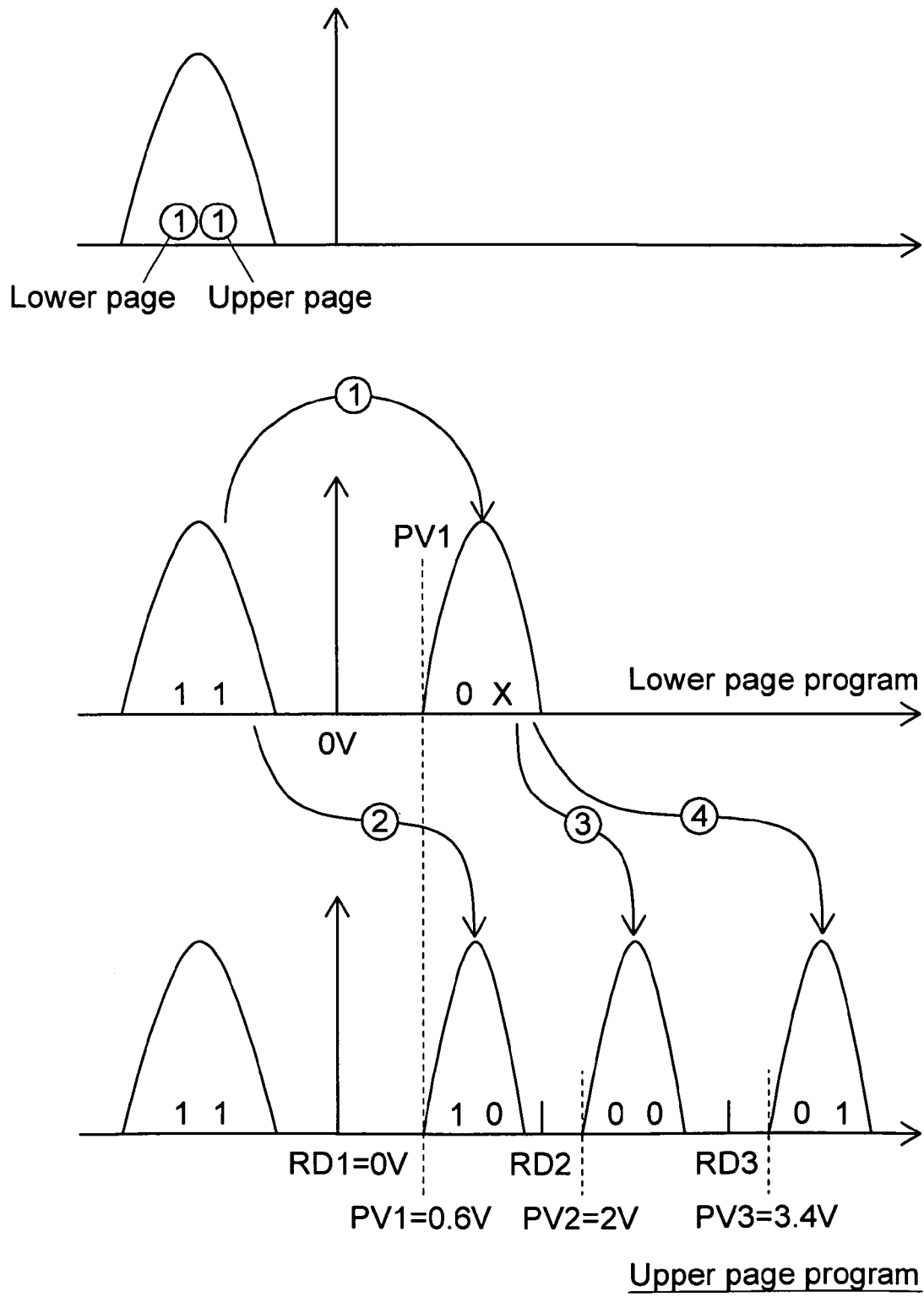
FIG. 4 is a diagram of a program sequence of the page buffer of FIG. 2 for lower-page and upper-page program operations.

After the data input, there are two cases of program operations. Case 1 is a lower-page program operation for programming the data of the lower page to the first bit of the target cell A, which can be treated as a single level cell (SLC) behavior as shown by the program path 1 in FIG. 4. Case 2 is an upper-page program operation for programming the data of the upper page to the second bit of the target cell A, during which the lower page information from the target cell A is needed. As shown in FIG. 4, if the data stored in the first bit (the left bit) is "1", the program sequence goes by the program path 2 to produce the program state "10", while if the data stored in the first bit is "0", the program sequence goes by the program paths 3 and 4 to respectively produce the program states "00" and "01". Not a Vt jump from "11" to "01" is good since too large charges changed will result in some couple-effect.

Lower Page Program

Figure 5:
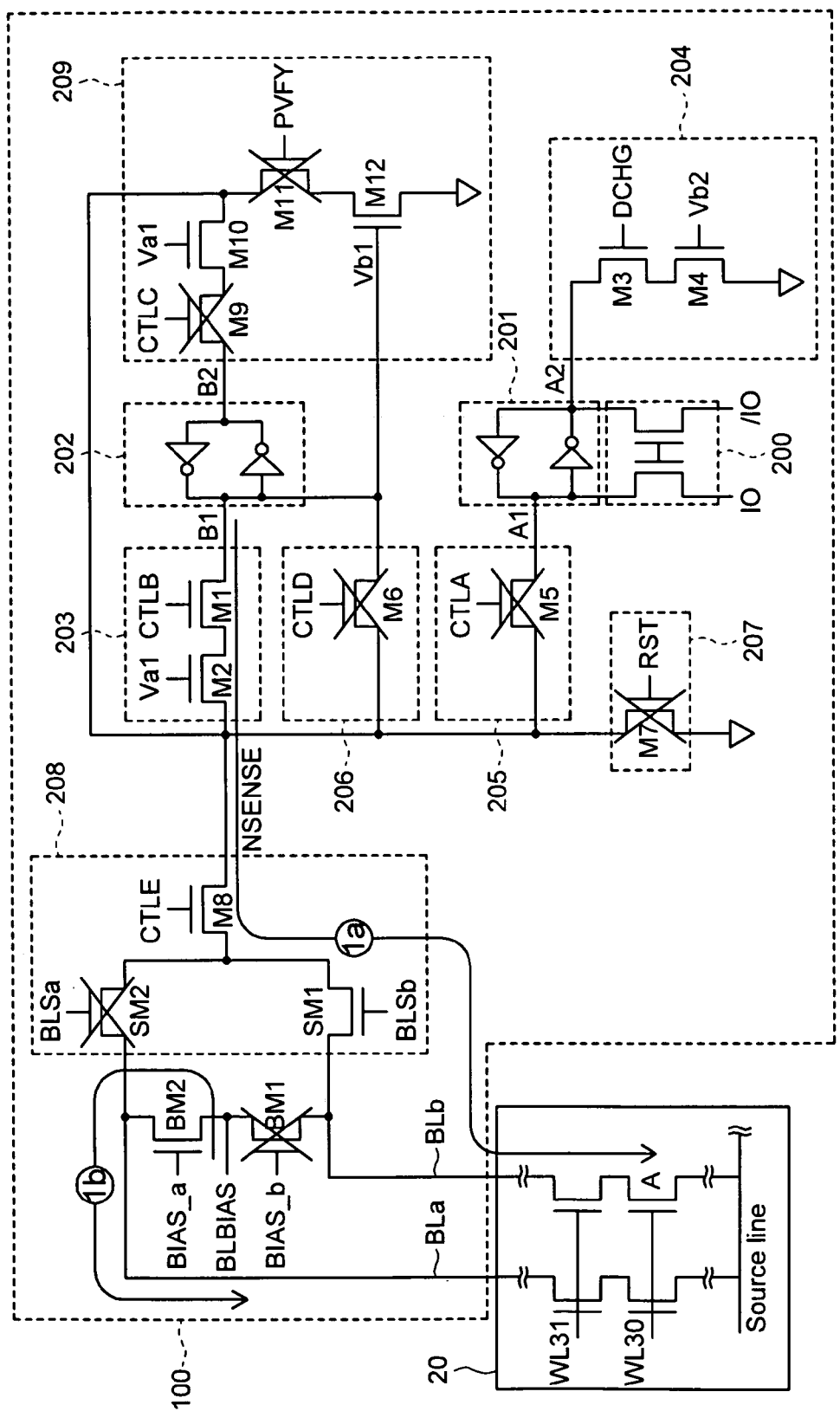
FIG. 5 is a circuit diagram of a lower-page program operation of the page buffer in FIG. 2.

Referring to FIG. 5, a circuit diagram of a lower-page program operation of the page buffer 100 in FIG. 2 is shown. In the lower-page program operation, the first switch (M1), the eighth switch (M8) and the first select switch (SM1) are turned on by the control signals CTLB, CTLE and BLSb (with the high level), respectively. The second switch (M2) is also turned on by the voltage Va1 of the first terminal A1 of the first latch 201, while the second select switch (SM2), the NMOS transistor BM1, the fifth switch 205 (M5), the sixth switch 206 (M6), the seventh switch (M7), the ninth switch (M9) and the eleventh switch (M11) are respectively turned off by control signals BLSa, BIAS_b, CTLA, CTLD, RST, CTLC and PVFY (with the low level) in order to charge or discharge the selected first bit line BLb to the voltage Vb1 ("1" or "0") of the first terminal B1 of the second latch 202 and program the data stored in the second latch 202 to the target cell A as shown by the path 1a.

The selected bit line BLb has the ground voltage ("0") means the target cell A is under programming if the word-line voltage of the target cell A is a high voltage, e.g. 20V, while the selected bit line BLb has the high voltage VDD ("1") means program inhibition. At the same time, the NMOS transistor BM2 is turned on to bias the un-selected second bit line BLa by the voltage BLSIAS (e.g. VDD) for preventing program disturbance of the un-selected adjacent cell.

It is noted that a special function named "program protection" is done by the program control unit 203. The program bias can setup the selected bit line BLb only when the voltage Va1 of the first terminal A1 of the first latch 201 has the high level "1". Based on the data input phase shown by the path 3 of FIG. 3, the first terminal A1 of the first latch 201 will be guaranteed to have the high voltage VDD and the data of the lower page can be programmed to the target cell A. This special function will be useful in the upper-page program phase as discussed in the following description.

Lower Page Program-Verify

Figure 6A:
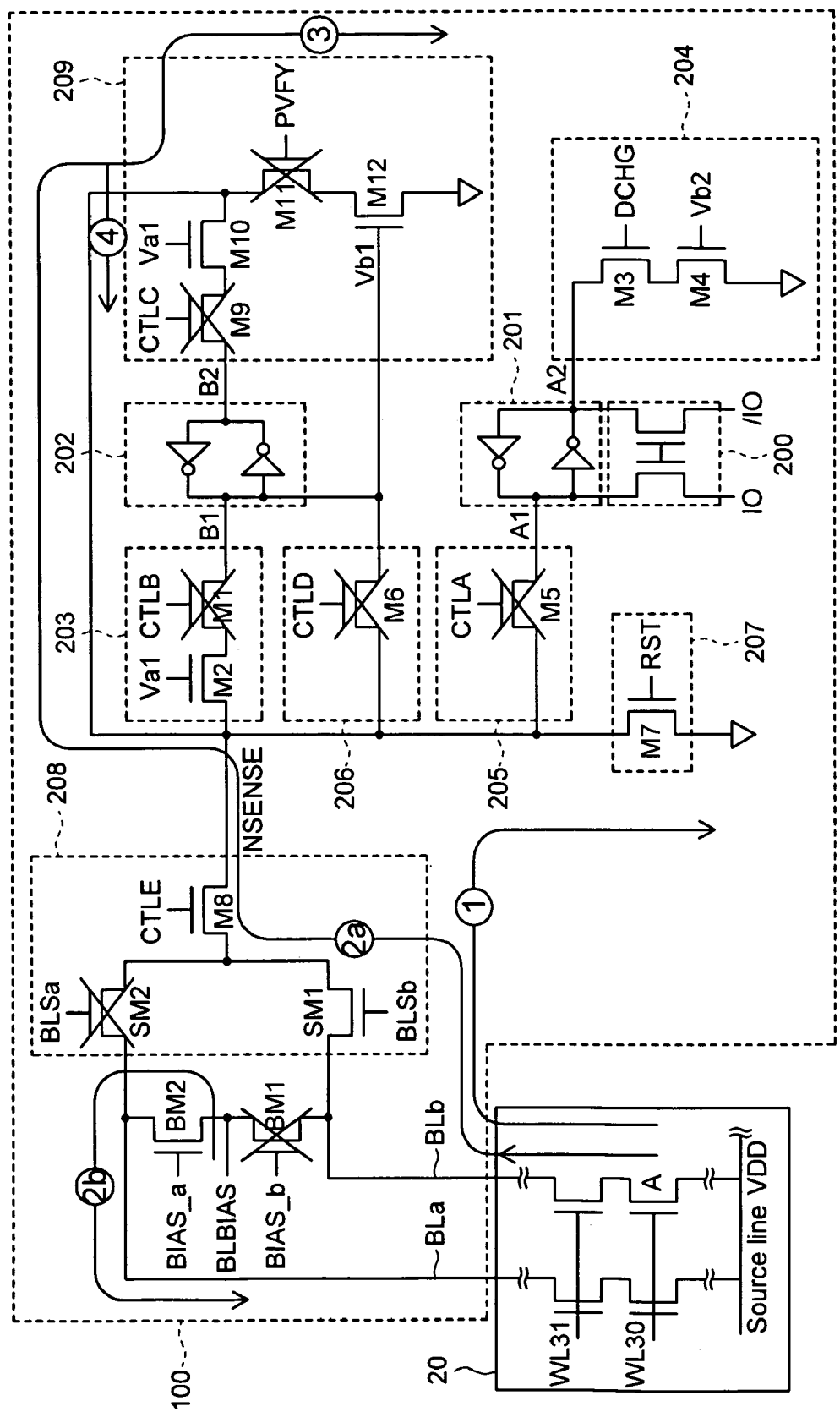
FIG. 6A is a circuit diagram of a lower-page program-verify operation of the page buffer in FIG. 2.
Figure 6B:
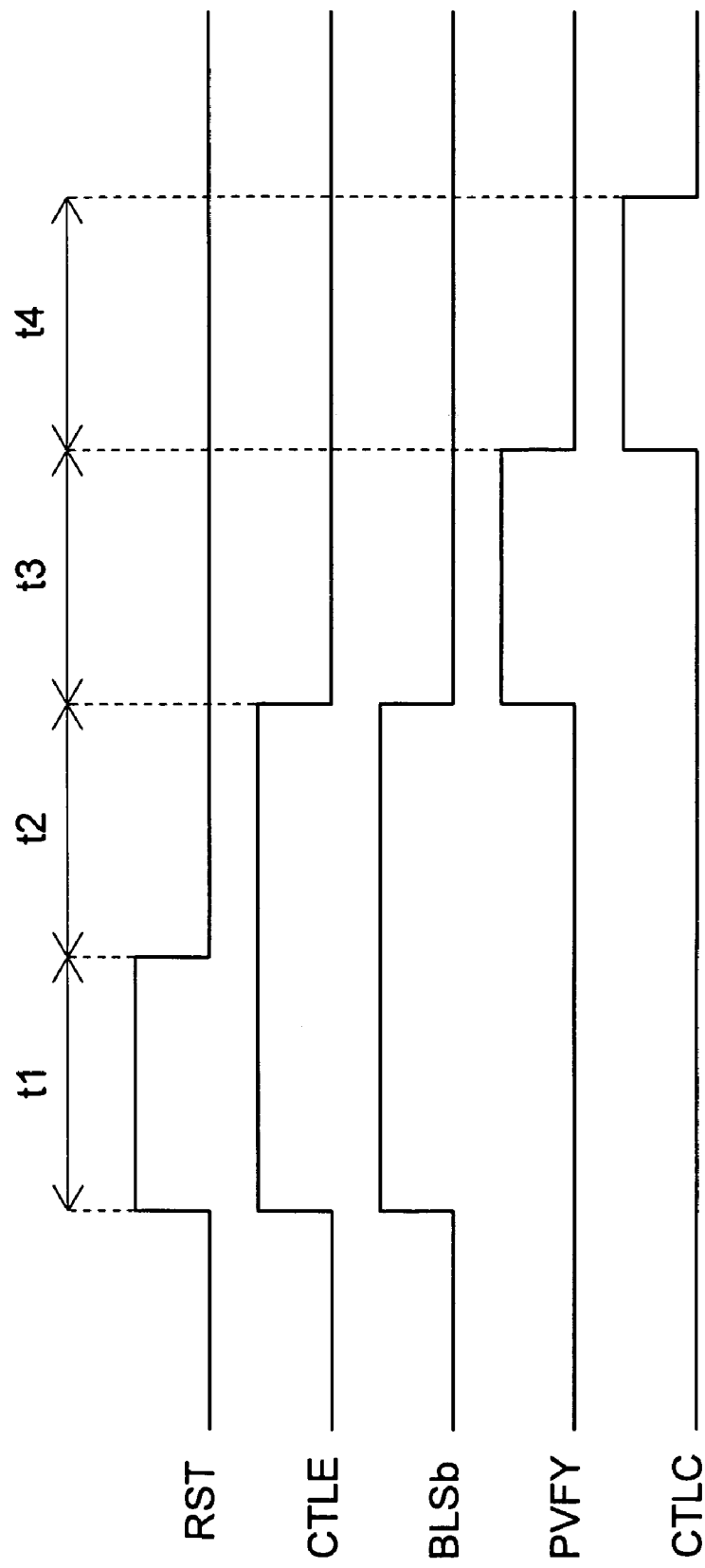
FIG. 6B is an example of sequence relationship of the control signals during the lower-page program-verify operation of FIG. 6A.

Referring to FIG. 6A and FIG. 6B, a circuit diagram of a lower-page program-verify operation of the page buffer 100 in FIG. 2 and an example of sequence relationship of the control signals during the lower-page program-verify operation of FIG. 6A are respectively shown. In the lower-page program-verify operation, the first switch (M1), the fifth switch 205 (M5) and the sixth switch 206 (M6) are turned off by the control signals CTLB, CTLA and CTLD (with the low level). As shown in FIG. 6B, in the period t1, the control signals RST, CTLE and BLSb have the high level, while the control signals PVFY and CTLC have the low level. As shown in FIG. 6A, the seventh switch (M7), the eighth switch (M8) and the first select switch (SM1) are respectively turned on by the control signals RST, CTLE and BLSb such that the first bit line BLb, the second bit line BLa and the first terminal NSENSE of the second switch (M2) corresponding to each page buffer 100 are discharged to the ground voltage through the turned-on seventh switch (M7), eighth switch (M8) and select switch (SM1) along the path 1.

Then, in the period t2, the control signals PVFY and CTLC are kept to have the low level. The second select switch (SM2) and the NMOS transistor BM1 are respectively turned off by the control signals BLSa and BIAS_b (with the low level), the seventh switch (M7) is turned off (not shown) by the control signal RST (with the low level), and the eighth switch (M8) and the select switch (SM1) are kept to be turned on by the control signals CTLE and BLSb (with the high level). The voltage of the word line WL30 of the target cell A is set to have the first PV level PV1, e.g. 0.6V, corresponding to the program state "10" as shown in FIG. 4, and the word lines (e.g. WL31) of the unselected cells are set to have a high voltage, which is high enough to turn-on a high-Vt cell. At the time, the voltage of the first terminal NSENSE of the second switch (M2) is charged up to a high voltage, e.g. VDD, from a source line if the target cell A is a low-Vt cell and kept at the ground voltage if the target cell A is a high-Vt cell, as shown by the path 2a of FIG. 6A. At the same time, the NMOS transistor BM2 is turned on to provide the voltage BLBIAS (a high voltage) to the unselected bit line BLa along the path 2b of FIG. 6A in order to achieve a shielding effect.

It is noted that the above operation through the path 2a is different from the traditional method in which the source-line is biased ground, and the terminal NSENSE will be discharged to ground if the selected cell has the first bit "1", while the terminal NSENSE will be kept at the high level if the selected cell has the first bit "0". Also, the voltage of the terminal NSENSE of the invention can also be built up by any other method as long as it can achieve the condition: "NSESNE" has the high level for the target cell A with the first bit "1" and "NSENSE" has the low level for the target cell A with the first bit "0".

Next, in the period t3, the control signal PVFY is changed to have the high level to turn on the eleventh switch (M11) with the control signals RST, CTLE, BLSb and CTLC all having the low level, and then in the period t4, the control signal CTLC is changed to have the high level to turn on the ninth switch (M9) with the control signals RST, CTLE, BLSb and PVFY all having the low level.

If the voltage Vb1 of the first terminal B1 of the second latch 202 has the high level "1", it means not programming, the target cell A is read as a low-Vt cell, the first terminal NSENSE of the second switch (M2) is first charged to the high voltage VDD in the period t2. Then, in the period t3, the ninth switch (M9) is turned off by the control signal CTLC, the eleventh switch (M11) is turned on by the control signal PVFY, and the twelfth switch (M12) is also turned on by the voltage Vb1 (="1") of the first terminal B1 of the second latch 202 to ground the terminal NSENSE along the path 3. Afterward, in the period t4, the voltage Vb2 of the second terminal B2 of the second latch 202 is grounded through the turned-on switches (M9 and M10) along the path 4 such that the voltage Vb1 of the first terminal B1 of the second latch 202 is kept at the high level "1".

If the voltage Vb1 of the first terminal B1 of the second latch 202 has the low level "0", which means programming, and the target cell A is programmed high enough and read as a high-Vt cell, the first terminal NSESNE of the second switch (M2) is at the low level "0" in the period t2. Then, in the period t3, the ninth switch (M9) is turned off by the control signal CTLC and the twelfth switch (M12) is also turned off by the voltage Vb1 (="0") of the first terminal B1 of the second latch 201. Afterward, in the period t4, the ninth switch (M9) is turned on by the control signal CTLC and the tenth switch (M10) is also turned on by the voltage Va1 (="1") to ground the voltage Vb2 of the second terminal B2 of the second latch 202 (along the path 4) such that the voltage Vb1 of the first terminal B1 of the second latch 202 is changed to have the high level "1".

If the voltage Vb1 of the first terminal B1 of the second latch 202 has the low level "0", which means programming, and the target cell A is programmed not high enough and read as a low-Vt cell, the first terminal NSENSE of the second switch (M2) is charged to the high voltage VDD in the period t2. Then, in the period t3, the ninth switch (M9) is turned off by the control signal CTLC (with the low level), and the twelfth switch (M12) is turned off by the voltage Vb1 (="0") of the first terminal B1 of the second latch 202. Afterward, in the period t4, the ninth switch (M9) is turned on by the control signal CTLC (with the high level) and the tenth switch (M10) is also turned on by the voltage Va1 (="1") to charge up the second terminal B2 of the second latch 202 to the high voltage VDD (along the path 4) such that the voltage Vb1 of the first terminal B1 of the second latch 202 is kept at the low level "0". The value "0" at the terminal B1 means further program pulse is needed for the target cell A.

Circuit For Judging Program-Verify

Figure 7:
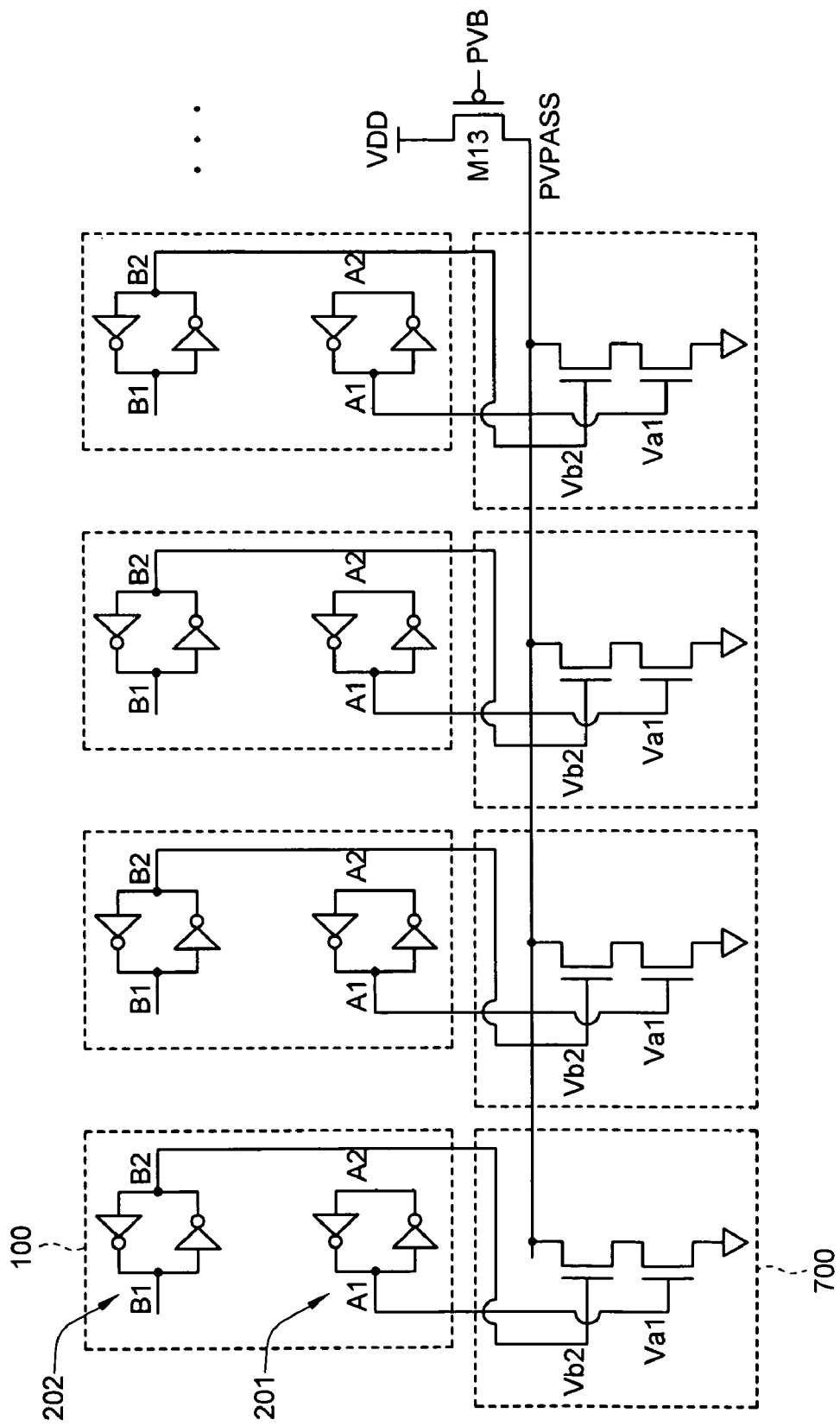
FIG. 7 is a circuit diagram of a circuit coupled to the page buffers of FIG. 2 for judging the program-verify operation.

Referring to FIG. 7, a circuit diagram of a circuit coupled to the page buffers 100 of FIG. 2 for judging the program-verify operation is shown. The page buffer circuit further includes a number of switch sets 700 correspondingly coupled to the page buffers 100 and a thirteenth switch coupled to the switch sets 700. In FIG. 7, only the first latch 201 and the second latch 202 are shown in each page buffer 100 for illustration convenience. Each switch set 700 includes a first pass switch, such as a NMOS transistor PM1 and a second pass switch, such as a NMOS transistor PM2. The first pass switch (PM1) is controlled by the voltage Vb2 of the second terminal B2 of the second latch 202 in the corresponding page buffer 100. The second pass switch (PM2) is coupled between a second terminal of the first pass switch (PM1) and the ground voltage and controlled by the voltage Va1 of the first terminal A1 of the first latch 201. The thirteenth switch, such as a P-type metal oxide semiconductor (PMOS) transistor M13, includes a first terminal coupled to the high voltage VDD and a second terminal PVPASS coupled to first terminals of the second pass switches (PM2).

The thirteenth switch (M13) is first turned on by the control signal PVB (with the low level) to charge the second terminal PVPASS of the thirteenth switch (M13) to the high voltage VDD. The lower-page or upper-page program-verify operation is determined to finish when the voltages Vb1 of the first terminals B1 of the second latches 202 have the high level "1" and thus the voltages Vb2 of the second terminals B2 of the second latches 202 have the low level "0" in all the page buffers 100 (i.e. Vb1 is all "1") to turn off the corresponding first pass switches (PM1) and keep the second terminal PVPASS of the thirteenth switch (M13) to have the high voltage VDD. On the contrary, the lower-page or upper-page program-verify operation is determined to fail when the voltage Vb1 of the first terminal B1 of the second latch 202 has the low level "0" and thus the voltage Vb2 of the second terminal B2 of the second latch 202 has the high level "1" in at least one page buffer 100 (i.e. not all Vb1 is "1") such that the corresponding first pass switch (PM1) is turned on and the corresponding second pass switch (PM2) is also turned on by the voltage Va1 (="1") of the first terminal A1 of the first latch 201 to ground the second terminal PVPASS of the thirteenth switch (M13).

Upper-Page Data Input

Figure 8:
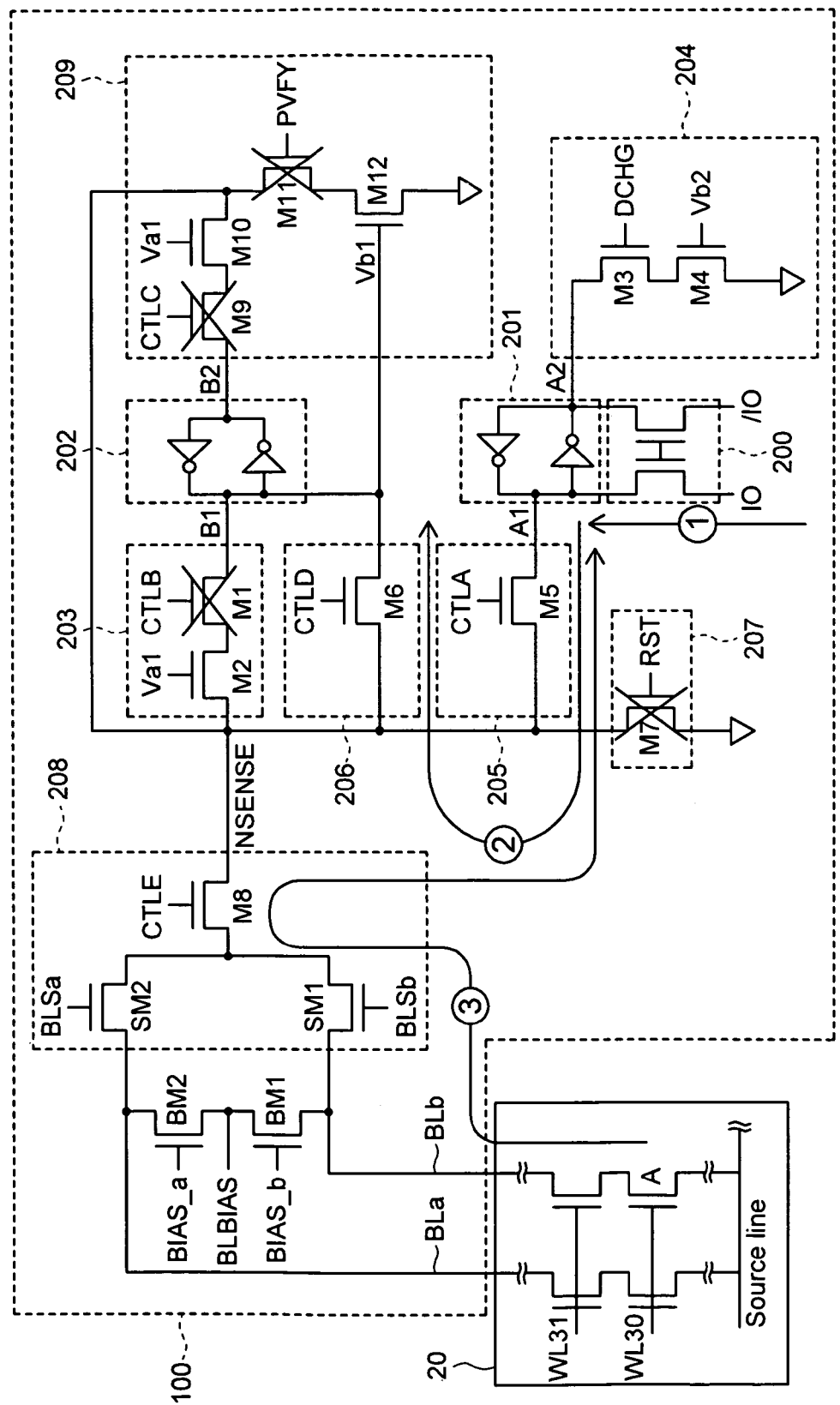
FIG. 8 is a circuit diagram of an upper-page data input operation of the page buffer in FIG. 2.

Referring to FIG. 8, a circuit diagram of an upper-page data input operation of the page buffer 100 in FIG. 2 is shown. The data of the upper page is first inputted from the data input unit 200 to the first latch 201 and then loaded from the first latch 201 to the second latch 202 as shown by the paths 1 and 2, which are the same as those in FIG. 3. As mentioned above, programming the data of the upper page needs information of the lower-page data in the target cell A. Thus, the word-line voltage of the target cell A is set to 0V as shown in FIG. 4, and the eighth switch (M8) and the first select switch (SM1) are turned on by the control signals CTLE and BLSb (with the high level) to read the data of the lower page from the first bit of the target cell A to the first terminal A1 of the first latch 201 via the selected first bit line BLb and the fifth switch 205 (M5) through the path 3. The path 3 is related to the read operation, of which the detail description will be explained in the chapter of the read phase.

After reading the data of the lower page from the target cell A, if the target cell A is a low-Vt cell, the first terminal A1 of the first latch 201 is charged to have the high level "1", and if the target cell A is a high-Vt cell, the first terminal A1 of the first latch 201 is set to the low level "0". The data of the lower page is stored at the first terminal A1 of the first latch 201, meanwhile the data of the upper page has already stored at the first terminal B1 of the second latch 202. Therefore, there are four conditions of (Va1, Vb1): (1, 1), (1, 0), (0, 0) and (0, 1), which represent the expected Vt distributions after the upper page program are as the definition of FIG. 1B.

Upper Page Program

Similar to the lower-page program operation shown in FIG. 5, in the upper-page program operation, the first switch (M1), the eighth switch (M8) and the first select switch (SM1) are turned on, the fifth switch 205 (M5), the sixth switch 206 (M6), the seventh switch (M7), the ninth switch (M9) and the eleventh switch (M11) are turned off. However, in this case, the first terminal A1 of the first latch 201 storing the data of the lower page can have either the high level "1" or the low level "0", which is different from the lower-page program setting the terminal A1 to be always "1". Thus, the second switch (M2) will be turned off if the voltage Va1 of the first terminal A1 of the first latch 201 has the low level "0" and is turned on to charge or discharge the selected first bit line BLb to the voltage Vb1 of the first terminal B1 of the second latch 201 if the voltage Va1 of the first terminal A1 of the first latch 201 has the high level "1". That is, the data of the upper page can be programmed into the target cell A only when the pattern (Va1, Vb1) is (1, 0) corresponding to the program state "10".

Upper Page Program-Verify

Similar to the lower-page program-verify operation, the upper-page program-verify operation for the pattern (Va1, Vb1)=(1, 0) includes the steps shown by the paths 1~4 in FIG. 6A with the NMOS transistors M1, M5, M6, SM2 and BM1 all turned off. If the cells with the program state "10" all pass the program-verify, i.e. the terminal PVPASS of the thirteenth switch (M13) has the high voltage VDD, the corresponding pattern (Va1, Vb1) is changed from (1, 0) to (1, 1), and there will remained the cells with the program states "11", "00" and "01" to be programmed corresponding to the patterns (Va1, Vb1) =(1, 1), (0, 0) and (0, 1). It is noted that during the upper-page program-verify operation of the cells "10", the (0,0) and (0,1) pattern corresponding to (A1, B1) will not change the value no matter what the read result of the verify path (3) and (4) of FIG. 6A because the switch M10 is turned off by the voltage signal Va1.

Figure 9:
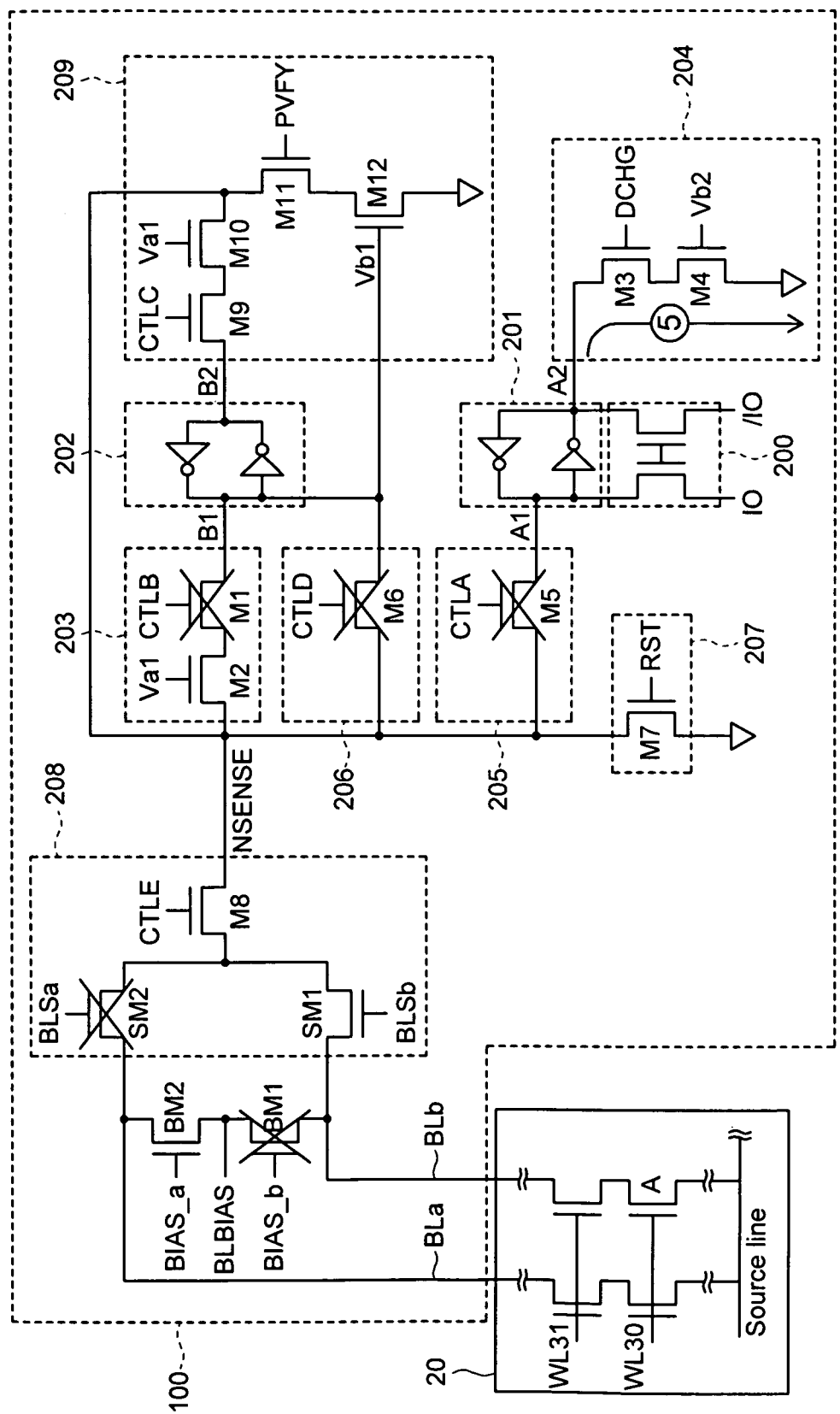
FIG. 9 is a circuit diagram of an upper-page program-verify operation of the page buffer in FIG. 2 with data change after the program-verify of the cells "10".

Referring to FIG. 9, a circuit diagram of an upper-page program-verify operation of the page buffer 100 in FIG. 2 with data change after the program-verify of the cells "10" is shown. After the upper-page program-verify operation of the cells "10" has finished, in the page buffers 100 corresponding to the cells "00", the third switches (M3) are turned on by the control signal DCHG (with the high level) and the fourth switches (M4) are also turned on by the voltage Vb2 (="1") of the second terminals B2 of the second latches 202 to ground the voltage Va2 of the second terminals A2 of the first latches 201 as shown by the path 5, and change the voltage Va1 of the first terminals A1 of the first latches 201 to have the high level "1", i.e. change the pattern (Va1, Vb1) from (0, 0) to (1, 0). After this path 5 of FIG. 10, there will exist only the pattern (1,1), (1,0) and (0,1), and then, the programming of (0,0) can be the same as the previous operation of (1,0). Then the cells with the program state "00" is program-verified through the paths 1~4 of FIG. 6A according to the corresponding second PV level PV2, e.g. 2V, shown in FIG. 4.

Figure 10:
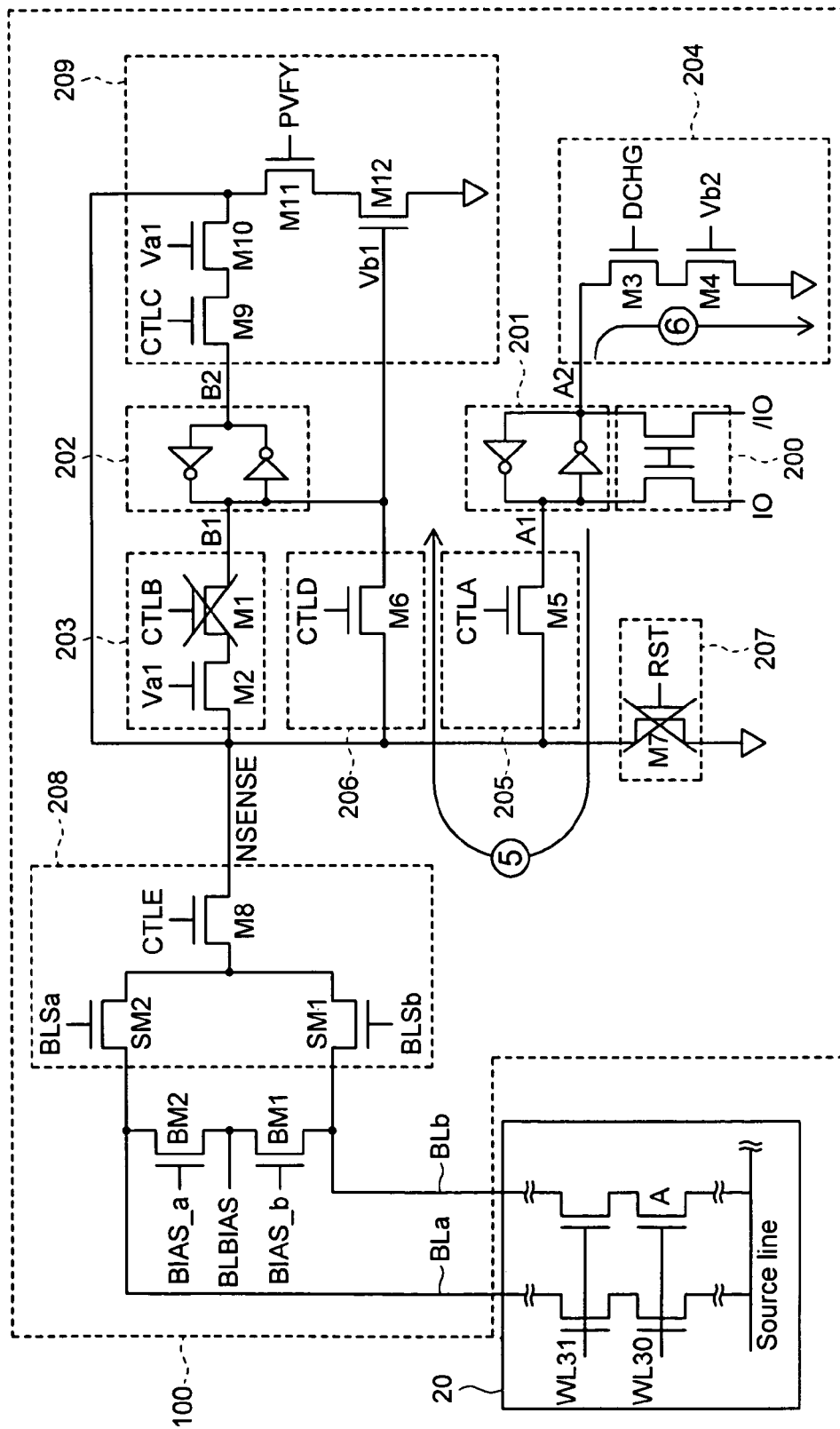
FIG. 10 is a circuit diagram of the upper-page program-verify operation of the page buffer in FIG. 2 with data change after program-verify of the cells "00".

Referring to FIG. 10, a circuit diagram of the upper-page program-verify operation of the page buffer 100 in FIG. 2 with data change after program-verify of the cells "00" is shown. After the upper-page program-verify operation of all the cells "00" has finished, i.e. the terminal PVPASS of the thirteenth switch (M13) has the high voltage VDD, there will exist only the pattern (1,1) and (0,1) of the latch-pair in the page buffers 100 corresponding to the cells with the program state "01", the first switch (M1) and the seventh switch (M7) are respectively turned off by the control signals CTLB and RST (with the low level), the fifth switches 205 (M5) and the sixth switches 206 (M6) are turned on by the control signals CTLA and CTLD (with the high level) to pass the data of the lower page ("0") from the first terminals A1 of the first latches 201 to the first terminals B1 of the second latches 201 as shown by the path 5, i.e. Vb1="0", then the third switches (M3) are turned on and the fourth switches (M4) are also turned on by the voltage Vb2 (="1") of the second terminals B2 of the second latches 202 to ground the voltage Va2 of the second terminals A2 of the first latches 201 as shown by the path 6, and change the voltage Va1 of the first terminals A1 of the first latches 201 to have the high level "1". Therefore, the pattern (Va1, Vb1)=(0, 1) will be changed to (1, 0), while the pattern (Va1, Vb1)=(1, 1) is not changed. After this data-change operation, the latch-pair of A1 and B1 will remain (1,1) or (1,0), then, the program and program-verify of the original (0,1) pattern can be the same as the (1,0) pattern as shown in FIG. 5 and FIG. 6A according to the corresponding third PV level PV3, e.g. 3.4V, as shown in FIG. 4.

As mentioned above, according to the protection function of the program control unit 203, the data can only be programmed to the cell array 20 when the first terminal A1 of the first latch 201 in the corresponding page buffer 100 is set to "1". The data of the upper page "0" can not be programmed to the cell array 20 when the data of the lower page is "0", and can only be programmed to the cell array 20 after the upper-page program and program-verify operations of the cells "10" have be finished. Similarly, the data of the upper page "1" can not be programmed to the cell array 20 when the data of the lower page is "0", and can only be programmed to the cell array 20 after the upper-page program and program-verify operations of the cells "10" have be finished. Therefore, the programming performance of the memory can be improved.

Lower Page Read

Figure 11:
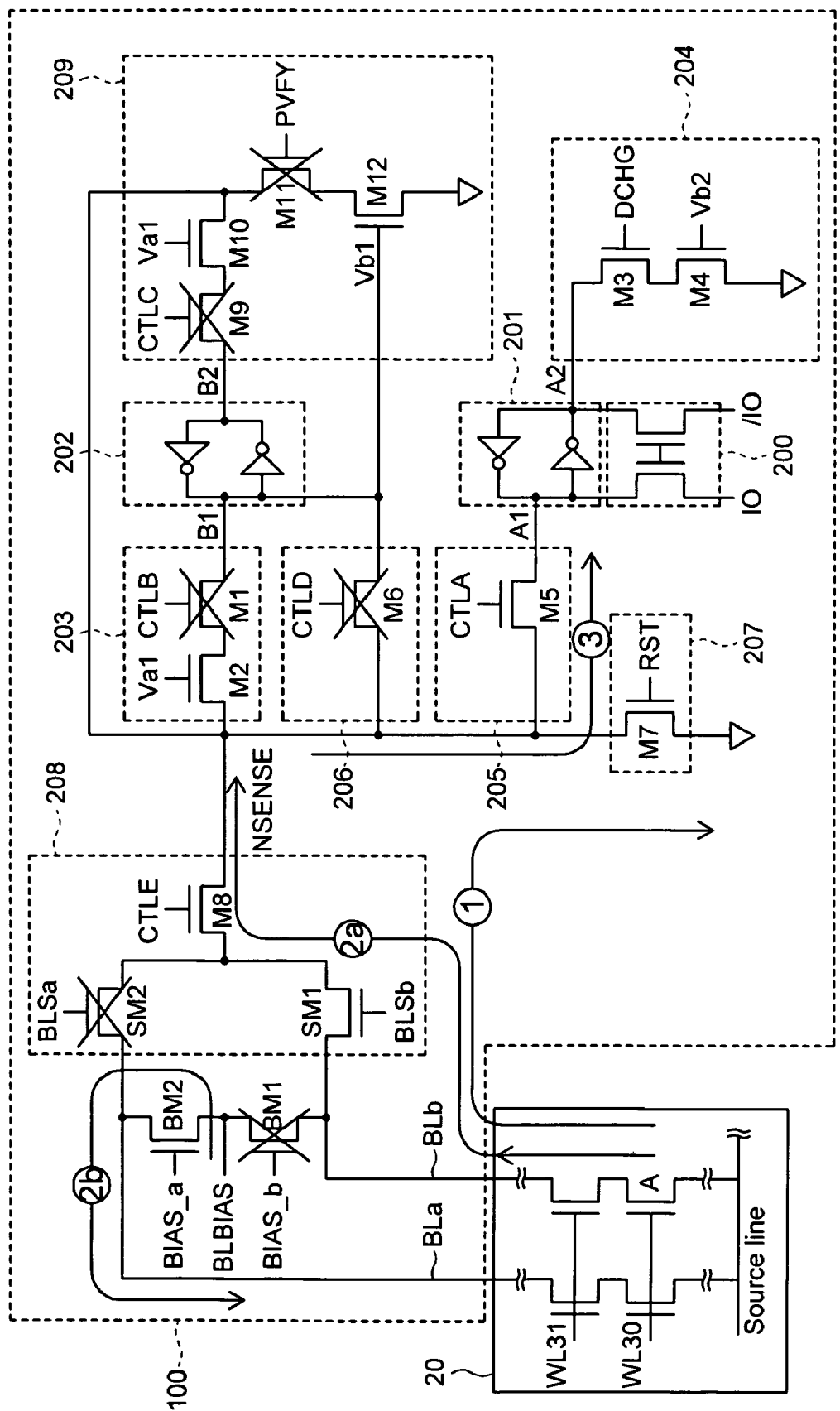
FIG. 11 is a circuit diagram of a lower-page read operation of the page buffer in FIG. 2.

Referring to FIG. 11, a circuit diagram of a lower-page read operation of the page buffer 100 in FIG. 2 is shown. Similar to the lower-page program-verify operation, in the lower-page read operation, the first switch (M1), the sixth switch 206 (M6), the ninth switch (M9) and the eleventh switch (M11) are respectively turned off by the control signals CTLB, CTLD, CTLC and PVFY (with the low level). The first bit line BLb, the second bit line BLa and the first terminal NSENSE of the second switch (M2) corresponding to each page buffer 100 are first discharged to the ground voltage by turning on the seventh switch (M7) by the path 1. Then, the second select switch (SM2) and the NMOS transistor BM1 are turned off, the word-line voltage of the target cell A is set to have a second RD level RD2 corresponding to the program state "00" as shown in FIG. 4. The voltage of the first terminal NSENSE of the second switch (M2) is charged up to the high voltage VDD from the source line by the path 2a if the target cell A is a low-Vt cell and kept at the ground voltage (via the path 2a) if the target cell A is a high-Vt cell. At the same time, the unselected bit line BLa is charged by the voltage BLBIAS through the turned-on transistor BM2 by the path 2b. Afterward, the voltage of the first terminal NSENSE is passed to the first terminal A1 of the first latch 201 by the path 3, and stored as the data of the lower page read from the target cell A.

Upper Page Read

Figure 12:
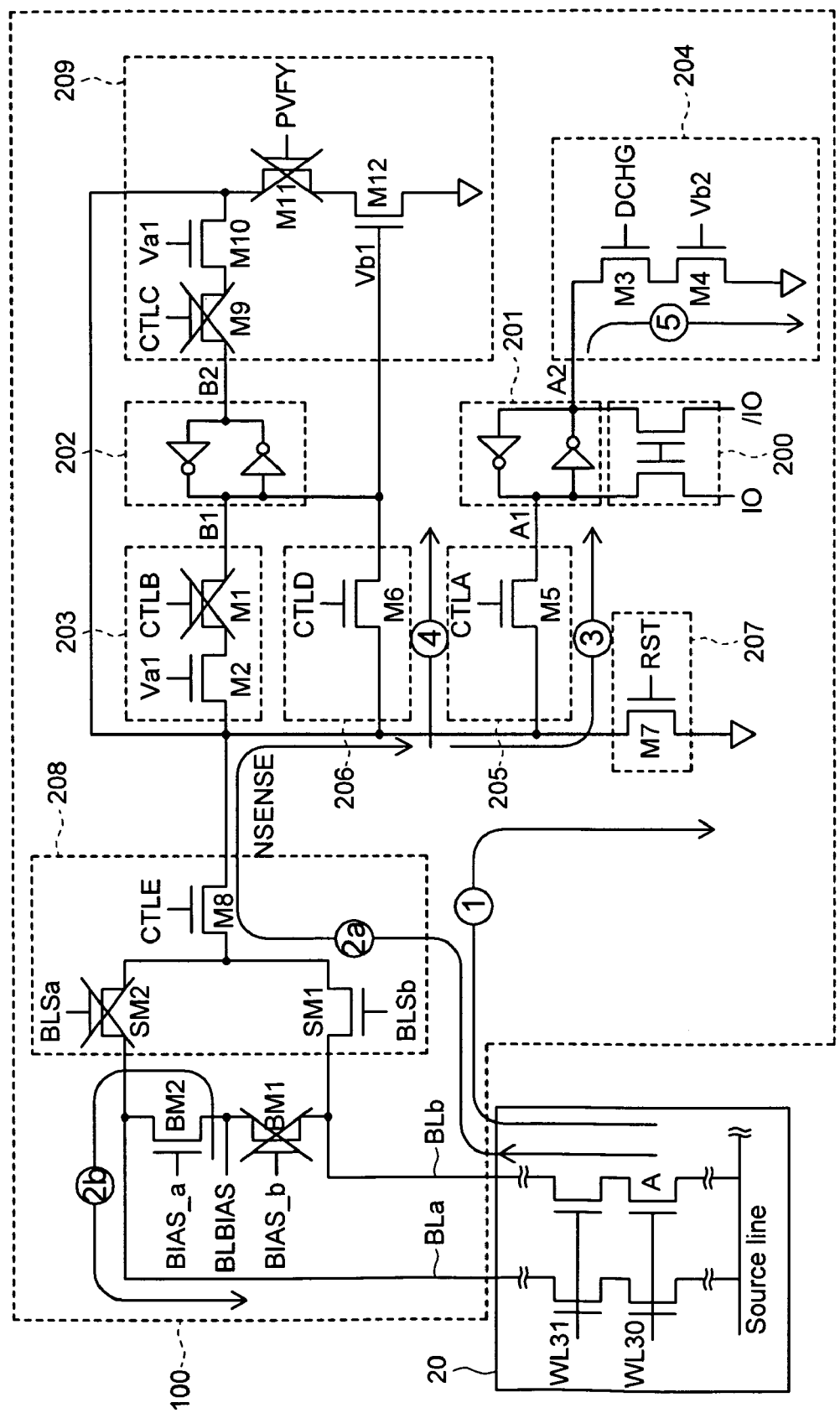
FIG. 12 is a circuit diagram of an upper-page read operation of the page buffer in FIG. 2.

Referring to FIG. 12, a circuit diagram of an upper-page read operation of the page buffer 100 in FIG. 2 is shown. In the upper-page read operation, the first switch (M1), the ninth switch (M9) and the eleventh switch (M11) are turned off by the control signals CTLB, CTLC and PVFY. The first bit line BLb, the second bit line BLa and the first terminal NSENSE of the second switch (M2) corresponding to each page buffer 100 are first discharged to the ground voltage by the path 1. Then, the second select switch (SM2) and the NMOS transistor BM1 are turned off, and a word-line voltage (WL) of the target cell A is set to a first RD level RD1 corresponding to the program state "10" as shown in FIG. 4. Under this condition, the data read from the target cell A is read to the first terminal NSENSE of the second switch (M2) by the path 2a and then passed to the first terminal A1 of the first latch 201 via the turned-on fifth switch 205 by the path 3, meanwhile the charging path 2b is produced. The voltage patterns of the terminals A1 and A2 corresponding to the four distributions "11", "10", "00" and "01" with WL=RD1 are shown in the upper table of FIG. 13.

Following that, the first bit line BLb, the second bit line BLa and the first terminal NSENSE of the second switch (M2) corresponding to each page buffer 100 are discharged to the ground voltage again by the path 1. At this time, the word-line voltage WL of the target cell A is set to a third RD level RD3 corresponding to the program state "01" as shown in FIG. 4 so as to read and pass the read data from the target cell A to the first terminal B1 of the second latch 202 via the turned-on sixth switch 206 (through the paths 2a and 4). The voltage patterns of the terminals B1 and B2 corresponding to the four distributions "11", "10", "00" and "01" with WL=RD3 are shown in the middle table of FIG. 13.

After the read data has been stored at the first terminal B1 of the second latch 202, the third switch (M3) is turned on by the control signal DCHG (with the high level). If the data stored at the first terminal B1 of the second latch 202 has the low level "0", the fourth switch (M4) is turned on by the voltage Vb2 (="1") of the second terminal B2 to ground the voltage Va2 of the second terminal A2 of the first latch 201 and change the first terminal A1 of the first latch 201 to have the high level "1". If the data stored at the first terminal B1 is "1", the fourth switch (M4) is turned off and the voltage Va1 at the first terminal A1 is not changed. Therefore, the voltage pattern of the first terminal A1 is changed from (1, 0, 0, 0) to (1, 0, 0, 1) after data change, and then the data stored at the first terminal A1 of the first latch 201 is read as the data of the upper page in the target cell A. By the above read operation, the read performance of the memory can be improved.

Program Method

Figure 14:
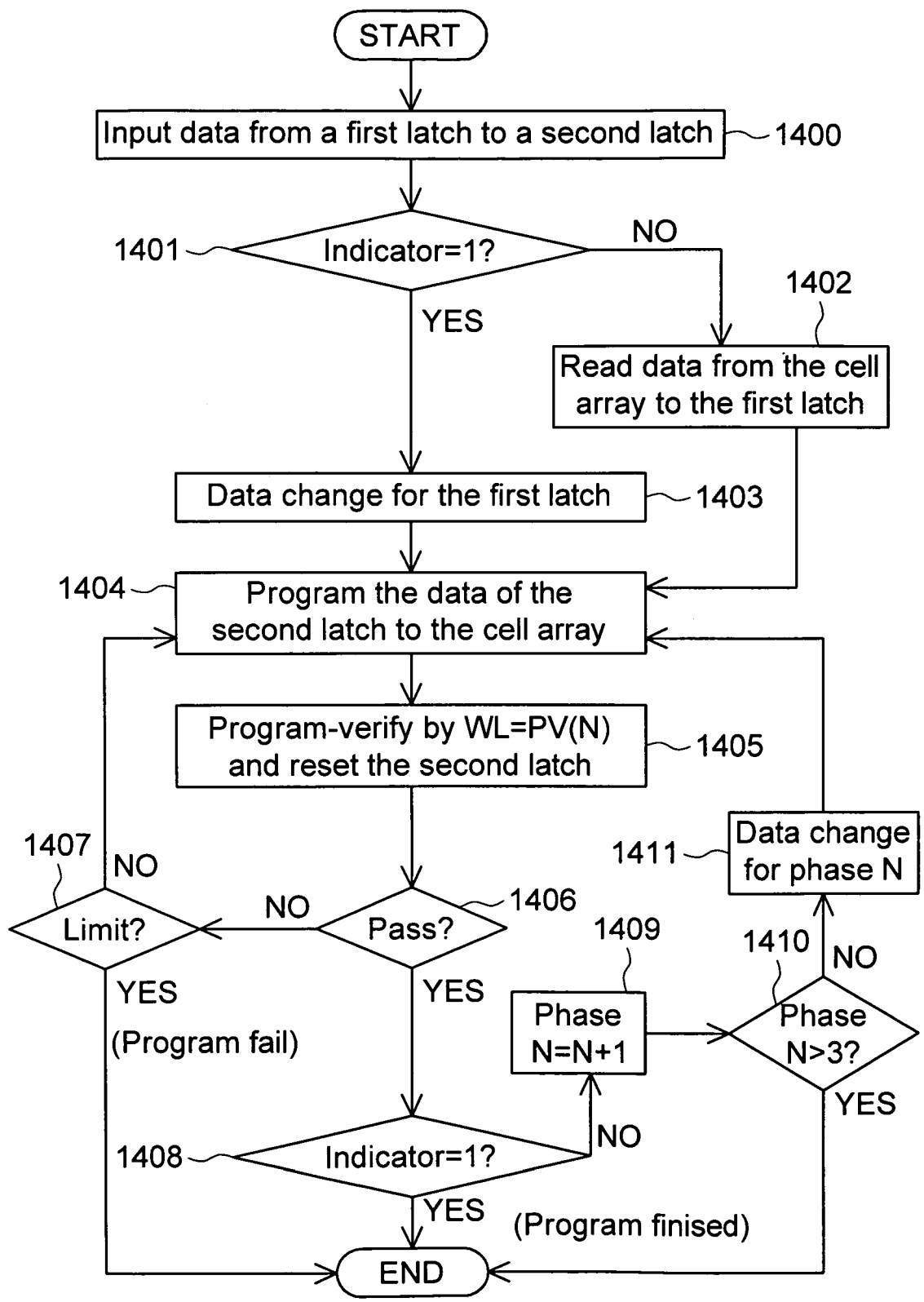
FIG. 14 is a flow chart of a method of programming a memory according to the preferred embodiment of the invention.

Referring to FIG. 14, a flow chart of a method of programming a memory according to the preferred embodiment of the invention is shown. The memory, such as a NAND flash memory, includes a cell array, such as the cell array 20 of FIG. 2. The cell array (20) includes a number of cells, and each cell has a first bit (e.g. the left bit) and a second bit (e.g. the right bit) respectively coming from a lower page and an upper page. For example, the method of programming a memory is applied to the above page buffer circuit.

First, in step 1400, input data to be programmed to the cell array from a first latch to a second latch. For example, the data is inputted to the first latch 201 and then transferred to the second latch 202 of the corresponding page buffer 100 through the paths 1 and 2 of FIG. 3. Next, in step 1401, determine whether an indicator-bit is "1" or not, i.e. whether any lower-page data has ever been programmed to the cell array 20 or not. If the indicator-bit is not "1", it means the lower-page data has ever been programmed to the cell array 20 and the user wants to program the upper page, proceed to the step 1402 to read data of the lower page from the cell array 20 and store the data of the lower page in the first latch 201 of the corresponding page buffer 100 through the path 3 of FIG. 8.

After the step 1402 of reading the data from the cell array 20 to the first latch 201, the first latch 201 is charged to the high level if the selected cell is a low-Vt cell, and the first latch 201 is set to the low level if the selected cell is a high-Vt cell.

If the indicator-bit is "1", it means that no lower-page data has been programmed to the cell array 20, and the user wants to program the lower page, proceed to the step 1403 to perform a data change operation for the first latch 201 by changing the voltage Va1 of the first latch 201 to the high level "1" when the data stored in the second latch 202 has a low level "0" and keeping the voltage Va1 of the first latch 201 at the high level "1" when the data stored in the second latch 202 has the high level "1" through the path 5 of FIG. 3.

Following the step 1403, in step 1404, program the data of the second latch 202 to the target cell on the cell array 20 through the path 1a of FIG. 5, wherein the data of the second latch 202 can be programmed to the target cell only when the voltage Va1 of the first latch 201 has the high level "1"(i.e. the above protection function). In the lower-page program operation, the voltage Va1 of the first latch 201 is set to "1", after the data change of the step 1403.

Then, in step 1405, perform a program-verify operation on the cell array 20 by setting a word-line voltage WL of the selected cells and resetting the second latch 202. For the lower-page program operation, the word-line voltage WL of the selected cell is set to PV(N=1)=PV1, such as 0.6V, wherein the phase N is a natural number, and the phase N is respectively 1, 2 and 3 corresponding to the program states "10", "00" and "01". That is, the level PV(N=2)=PV2, such as 2V, and the level PV(N=3)=PV3, such as 3.4V.

After the step 1402 of reading data from the cell array 20 to the first latch 201, the step 1404 is continued to perform an upper-page program operation for the program states "10" first, and then the step 1405 is performed by setting the word-line voltage WL of the selected cell to be PV(N=1) =PV1. The data of the upper page "0" is first programmed to the selected cell with data of the lower page "1" because during the upper-page program operation, the selected cell can be programmed by the data of the second latch 202 only when the data of the first latch 201 has the high level "1".

In the step of resetting the second latch 202, if the data of the second latch 202 programmed to the cell array 20 has the high level "1", the voltage Vb1 of the second latch 202 is kept at the high level "1" through the paths 2a, 3 and 4 of FIG. 6A. If the data of the second latch 202 programmed to the cell array 20 has the low level "0" and the selected cell is programmed high enough, the voltage Vb1 of the second latch 202 is changed to have the high level "1" through the paths 2a and 4 of FIG. 6A. If the data of the second latch 202 programmed to the cell array 20 has the low level "0" and the selected cell is programmed not high enough, the voltage Vb1 of the second latch 202 is kept at the low level "0" through the paths 2a and 4 of FIG. 6A.

Afterward, in step 1406, determine whether the program-verify operation passes or not, such as according to the voltage of the terminal PVPASS of FIG. 7. If the program-verify operation does not pass, i.e. the terminal PVPASS has the ground voltage, proceed to the step 1407 of determining whether an executing number of the program-verify operations has exceeded a preset limit (e.g. 64) or not. If the executing number of the program-verify operations has exceeded the limit, end the process with "program fail". If the executing number of the program-verify operations does not exceed the limit, continue the step 1404 of programming the data of the second latch 202 to the cell array 20.

If the program-verify operation passes, i.e. the terminal PVPASS has the high voltage VDD, proceed to the step 1408 of determining whether the indicator-bit is "1" or not. If the indicator-bit is "1", it means the step 1404 performs a lower-page program operation, end the process with (lower-page) program finish. If the indicator-bit is "0", it means the step 1404 performs an upper-page program operation, proceed to the step 1409 of increasing the phase N by 1, i.e. N=N+1. Then, continue to the step 1410 of determining whether the phase N is larger than 3 or not. If yes, end the process with (upper-page) program finish. If no, proceed to the step 1411 of performing a data change operation for the next phase N (i.e. a next program state) and continue the step 1404 of programming the data of the second latch 202.

After the upper-page program-verify operation of the cells with the program state "10" (N=1) has finished, the phase N is increased from 1 to 2 in the step 1409, and the data change for the phase N=2 corresponding to the program state "00" is performed to change the voltage Va1 of the first latch 201 to have the high level "1" through the path 5 in FIG. 9, and the program-verify operation for the cells with the program state "00" is performed according to the level PV(N=2)=PV2.

After the upper-page program-verify operation of the cells with the program state "00" (N=2) has finished, the phase N is increased from 2 to 3 in the step 1409, and the data change for the phase N=3 corresponding to the program state "01" is performed to pass the data of the first latch 201 to the second latch 202, and change the voltage Va1 of the first latch 201 to have the high level "1" through the paths 5 and 6 of FIG. 10. The program-verify operation for the cells with the program state "01" is performed according to the level PV(N=3)=PV3. By using the protection and data change functions, the program performance of the memory can be effectively enhanced.

Read Method

Figure 15:
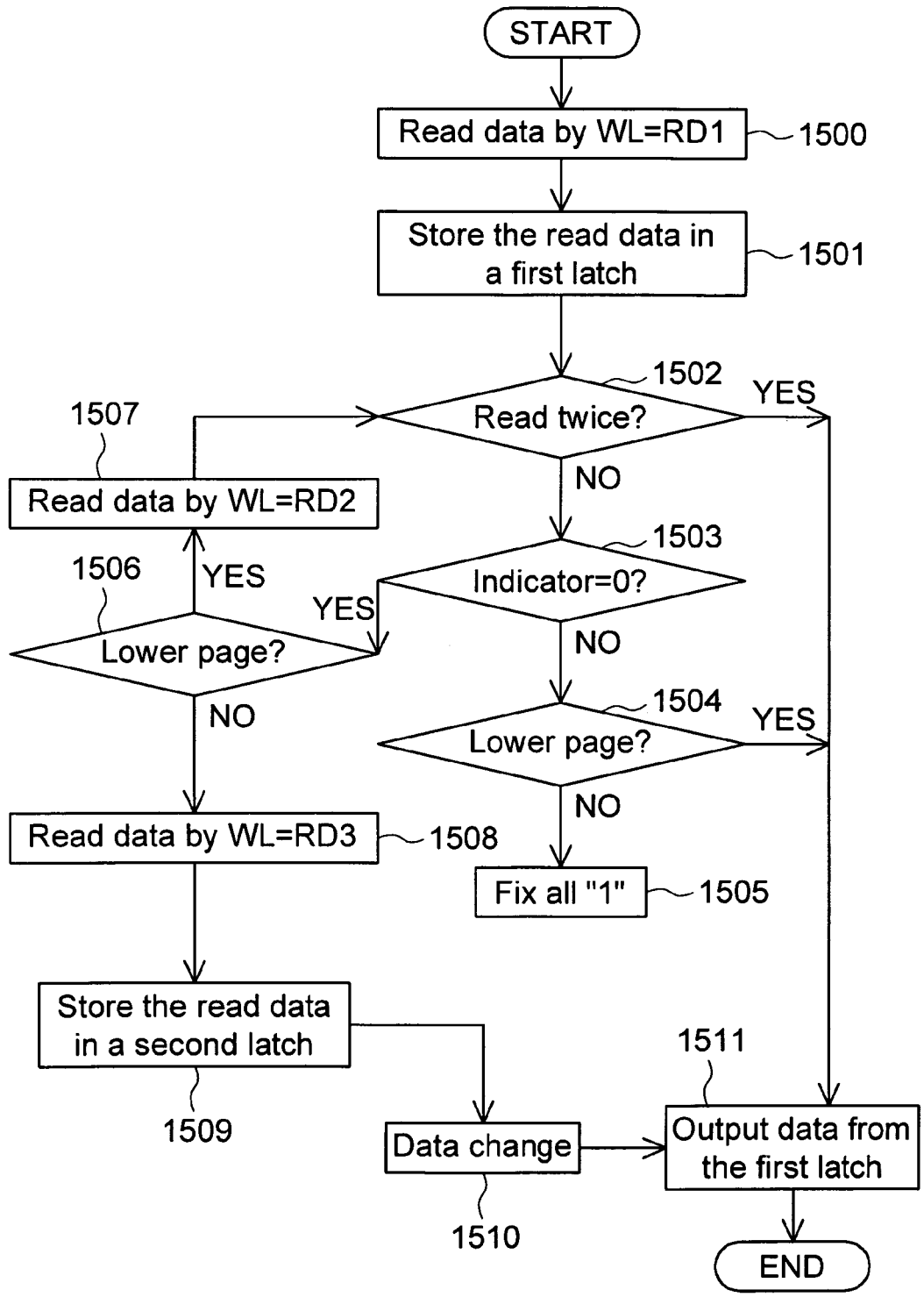
FIG. 15 is a flow chart of a method of reading a memory according to the preferred embodiment of the invention.

Referring to FIG. 15, a flow chart of a method of reading a memory according to the preferred embodiment of the invention is shown. The memory, such as a NAND flash memory, includes a cell array, such as the cell array 20 of FIG. 2. The cell array (20) includes a number of cells, and each cell has a first bit and a second bit respectively coming from a lower page and an upper page. For example, the memory of reading a memory is applied to the above page buffer circuit.

First, in step 1500, read data from a target cell, e.g. the cell A, according to a first RD level, e.g. RD1 (0V) corresponding to a first program state, e.g. "10". Before reading data from the target cell, all the bit lines coupled to the cell array 20, such as BLa and BLb, are first discharged to the ground voltage through the path 1 of FIG. 12. Next, in step 1501, store the read data in a first latch, such as the first latch 201, wherein the first RD level RD1 is smaller than a second RD level, e.g. RD2, corresponding to a second program state, e.g. "00".

Then, in step 1502, determine whether the target cell (A) has been read twice or not. If yes, proceed to the step 1511 of outputting data from the first latch 201. If no, proceed to the step 1503 of determining whether an indicator-bit is "0" or not, i.e. whether upper-page data has ever been programmed to the target cell or not. If the indicator-bit is "1", it means no upper-page data has been programmed to the target cell A, continue the step 1504 of determining whether the user wants to read data of the lower page. If the user wants to read data of the lower page, proceed to the step 1511 to output the data stored in the first latch 201 as the data of the lower page.

If the user wants to read data of the upper page, perform the step 1505 to fix the data of the upper page to be all "1" for the user since no upper-page data is programmed to the target cell. In the step 1503, if the indicator-bit is "0", it means upper-page data has ever been programmed to the target cell A, continue the step 1506 of determining whether the user wants to read data of the lower page. If the user wants to read data of the lower page, proceed to the step 1507 to read data from the target cell A according to a second RD level, e.g. RD2, corresponding to a second program state, e.g. "00". Similarly, before reading data from the target cell, all the bit lines coupled to the cell array 20, such as BLa and BLb, are first discharged to the ground voltage through the path 1 of FIG. 11. Then, continue the step 1501 of storing the read data in the first latch 201, and when the target cell A has been read twice, e.g. according to RD1 and RD2, the step 1511 is performed to output the data of the first latch as the data of the lower page.

In the step 1506, if the user wants to read data of the upper page, proceed to the step 1508 to read data from the target cell A according to a third RD level, e.g. RD3, corresponding to a second program state, e.g. "01". Similarly, before reading data from the target cell, all the bit lines coupled to the cell array 20, such as BLa and BLb, are first discharged to the ground voltage through the path 1 of FIG. 12. Following that, the step 1509 is performed to store the read data in a second latch, such as the second latch 202.

Figure 13:
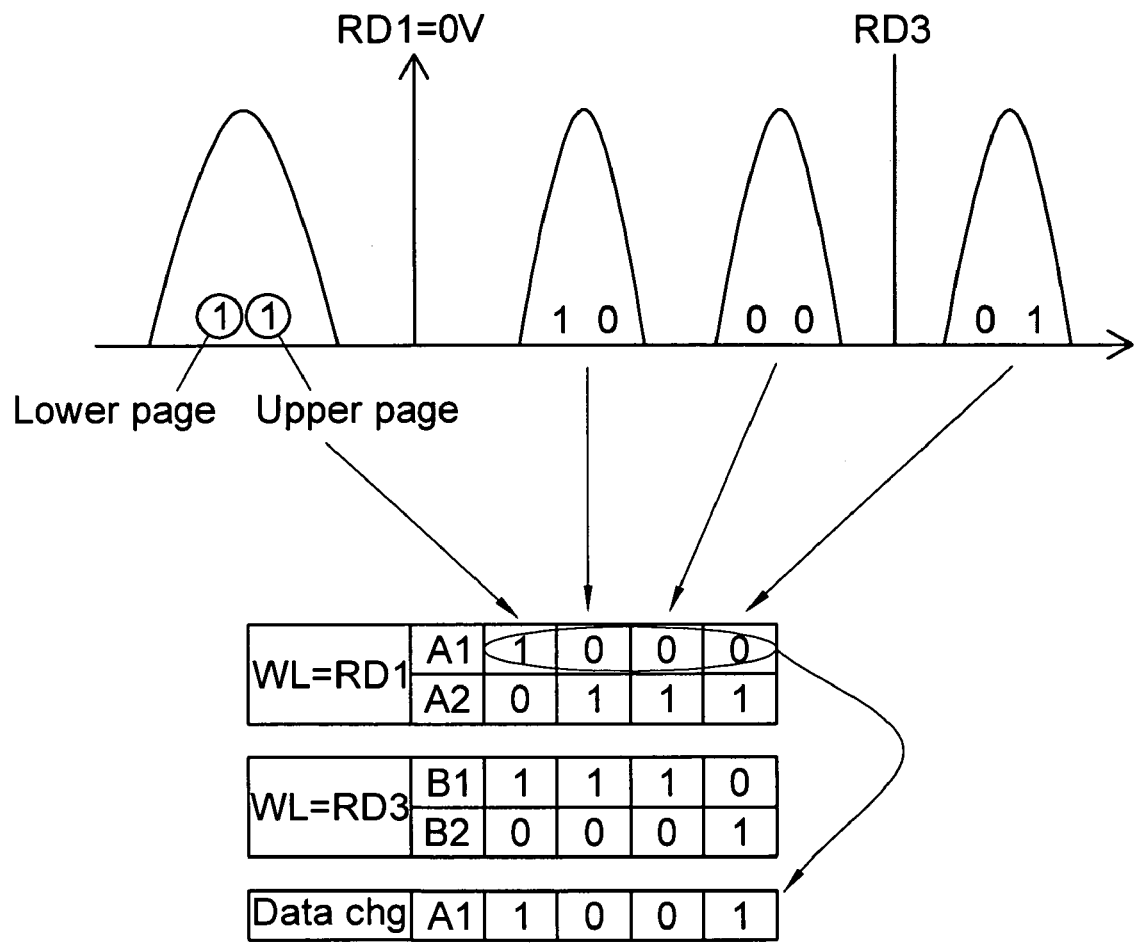
FIG. 13 is a diagram of an upper-page read and data change for the first latch in the page buffer of FIG. 2.

Afterward, in step 1510, perform a data change by changing the data of the first latch 201 (at the terminal A1) to have the high level "1" if the data stored in the second latch 202 (at the terminal B1) has the low level "0" and maintain the data of the first latch 201 (at the terminal A1) if the data stored in the second latch 202 (at the terminal B1) has the high level "1" as shown in the tables of FIG. 13. Finally, in step 1511, output the data stored in the first latch 201 after data change as the data of the upper page. Therefore, by reading the data of the upper page respectively according to the RD level RD1 and RD3 and using the data change function, the read performance can be effectively enhanced.

The page buffer and method of programming and reading a memory disclosed by the above embodiment of the invention provide the protection function that the data of the second latch can be programmed into the cell array only when the data of the first latch has the high level. Besides, by providing a data change function, the page buffer circuit programs and reads the data of the lower page as well as the upper page in turns of the program states "10", "00" and "01", thereby effectively improving the program and read performance of the memory.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A page buffer, applied in a memory, the memory comprising a plurality of cells, each cell having a first bit and a second bit respectively coming from a lower page and an upper page, the page buffer comprising:
    a first latch, comprising a first terminal for loading the data of the lower page and the upper page;
    a second latch, comprising a first terminal for storing the data of the lower page and the upper page from the first latch;
    a data change unit, coupled to a second terminal of the first latch for changing a voltage of the second terminal of the first latch to a low level; and
    a program control unit, coupled to the first terminal of the second latch and the cells, and controlled by the voltage of the first terminal of the first latch for respectively programming the data of the lower page and the upper page to a target cell.

2. The page buffer according to claim 1, wherein the data change unit changes the voltage level of the second terminal of the first latch to the low level such that the voltage of the first terminal of the first latch is changed to a high level when both the voltages of the first terminals of the first latch and the second latch have the low level.

3. The page buffer according to claim 1, wherein the program control unit can program the target cell only when the voltage of the first terminal of the first latch has a high level.

4. The page buffer according to claim 1, wherein the program control unit further comprises:
    a first switch, coupled to the first terminal of the second latch; and a second switch, comprising a first terminal coupled to the cells, and a second terminal coupled to the first switch, wherein the second switch is controlled by the voltage of the first terminal of the first latch, and is turned on when the voltage of the first terminal of the first latch has the high level.

5. The page buffer according to claim 4, wherein each of the first latch and the second latch comprises two inverters reversely coupled to each other in parallel such that the voltage of the first terminal of the first latch is phase-inverse to a voltage of the second terminal of the first latch and a voltage of the first terminal of the second latch is phase-inverse to a voltage of a second terminal of the second latch.

6. The page buffer according to claim 5, wherein the data change unit further comprises:
a third switch, coupled to the second terminal of the first latch; and
a fourth switch, coupled between the third switch and a ground voltage, and controlled by the voltage of the second terminal of the second latch.

7. The page buffer according to claim 6, wherein after the data of the lower page is inputted to the second latch, the third switch is turned on, when the data of the lower page has the low level, the fourth switch is also turned on by the voltage of the second terminal of the second latch to ground the voltage of the second terminal of the first latch and change the voltage of the first terminal of the first latch to have the high level.

8. The page buffer according to claim 6, wherein each of the page buffers further comprises a fifth switch coupled to the first terminal of the first latch and a sixth switch coupled between the fifth switch and the first terminal of the second latch for passing the data of the lower page and the upper page from the first latch to the second latch.

9. The page buffer according to claim 8, wherein each of the page buffers further comprises:
a seventh switch, coupled between the first terminal of the second switch and the ground voltage;
a selection unit comprising:
an eighth switch, coupled to the first terminal of the second switch; and
a first select switch and a second select switch, coupled to the eighth switch for respectively selecting a first bit line and a second bit line coupled to the cells; and
a program-verify unit comprising:
a ninth switch, coupled to the second terminal of the second latch;
a tenth switch, coupled to the ninth switch and controlled by the voltage of the first terminal of the first latch;
an eleventh switch, coupled to the tenth switch and the first terminal of the second switch; and
a twelfth switch, coupled between the eleventh switch and the ground voltage, and controlled by the voltage of the first terminal of the second latch.

10. The page buffer according to claim 9, wherein all the switches are implemented by N-type metal oxide semiconductor (NMOS) transistors.

11. The page buffer according to claim 1, wherein the memory comprises a plurality of page buffers and a thirteenth switch, the thirteenth switch has a first terminal coupled to the high voltage, and each of the page buffers further comprises:
a first pass switch, having a first terminal coupled to a second terminal of the thirteenth switch and controlled by the voltage of the second terminal of the second latch in the corresponding page buffer; and
a second pass switch coupled between a second terminal of the first pass switch and the ground voltage and controlled by the voltage of the first terminal of the first latch in the corresponding page buffer;
wherein the thirteenth switch is first turned on to charge the first terminal of the thirteenth switch to the high voltage;
wherein a lower-page or upper-page program-verify operation finishes when the voltages of the first terminals of the second latches have the high level and the voltages of the second terminals of the second latches have the low level in all the page buffers to turn off the corresponding first pass switches and keep the second terminal of the thirteenth switch to have the high voltage;
wherein the lower-page or second-page program-verify operation fails when the voltage of the first terminal of the second latch has the low level and the voltage of the second terminal of the second latch has the high level in at least one page buffer such that the corresponding first pass switch is turned on and the corresponding second pass switch is also turned on by the voltage of the first terminal of the first latch to ground the second terminal of the thirteenth switch.

12. A method of programming a memory, the memory comprising a plurality of cells, each cell having a first bit and a second bit respectively coming from a lower page and an upper page, the method comprising steps of:
inputting data to a first latch and transferring the data to a second latch;
determining whether the lower page has been programmed or not;
if the lower page has not been programmed and the data stored in the second latch has a low level, changing a voltage of the first latch to a high level; and
programming the data of the second latch to a selected cell.

13. The method of programming a memory according to claim 12, in the step of programming the data of the second latch to the selected cell, the data of the second latch can be programmed to the selected cell only when the voltage of the first latch has the high level.

14. The method of programming a memory according to claim 13, further comprising if the lower page has ever been programmed, reading data from the selected cell and storing the read data in the first latch and then continuing the step of programming the data of the second latch to the selected cell.

15. The method of programming a memory according to claim 14, wherein after the step of reading the data from the selected cell, the first latch is charged to the high level if the selected cell is a low-Vt cell, and the first latch is set to the low level if the selected cell is a high-Vt cell.

16. The method of programming a memory according to claim 12, further comprising: program-verifying the selected cell by setting a word-line voltage of the selected cell and resetting the second latch.

17. The method of programming a memory according to claim 16, wherein if the lower page has not been programmed, a lower-page program operation is performed on the memory cell in the step of programming the data of the second latch, and the word-line voltage of the selected cell is set to have a first PV level corresponding to a program state "10" in the step of program-verifying the selected cell.

18. The method of programming a memory according to claim 17, wherein if the lower page has been programmed, an upper-page program operation is performed on the memory cell in the step of programming the data of the second latch, and the selected cells with the program state "10" are first program-verified according to the first PV level in the step of program-verifying the selected cell.

19. The method of programming a memory according to claim 16, wherein in the step of resetting the second latch, when the data of the second latch programmed to the cell array has the high level, a voltage of the second latch is kept at the high level; when the data of the second latch programmed to the cell array has the low level and the selected cell is programmed high enough, the voltage of the second latch is changed to have the high level; and when the data of the second latch programmed to the cell array has the low level and the selected cell is programmed not high enough, the voltage of the second latch is kept at the low level.

20. The method of programming a memory according to claim 16, wherein after the step of program-verifying the selected cell, the method further comprises:
    ending the process if the program-verifying step does not pass and an executing number of the program-verifying steps has exceeded a preset limit;
    continuing the step of programming the data of the second latch to the selected cell if the program-verifying step does not pass and an executing number of the program-verifying steps does not exceed the preset limit;
    ending the process if a lower-page program operation is performed in the step of programming the data of the second latch and the program-verifying step passes; and
    performing a data change for a next program state and continuing the step of programming the data of the second latch if an upper-page program operation is performed in the step of programming the data of the second latch and the program-verifying step passes.

21. The method of programming a memory according to claim 20, wherein after the program-verifying step of the cells with the program state "10" has finished, the data change for the next program state "00" is performed to change the voltage of the first latch to have the high level such that the data of the second latch can be programmed to the selected cells in the programming step, and the cells with the program state "00" are program-verified according to a corresponding second PV level in the program-verifying step.

22. The method of programming a memory according to claim 21, wherein after the program-verifying step of the cells with the program state "00" has finished, the data change for the next program state "01" is performed to pass the data of the first latch to the second latch and change the voltage of the first latch to have the high level such that the data of the second latch can be programmed to the selected cells in the programming step, and the cells with the program state "01" l are program-verified according to a corresponding third PV level in the program-verifying step.

23. A method of reading a memory, the memory comprising a plurality of cells, each cell having a first bit and a second bit respectively coming from a lower page and an upper page, the method comprising steps of:
    reading data from a target cell according to a first read level;
    storing the read data in a first latch;
    if the upper page has been programmed and the upper page is to be read, reading the target cell according to a third read level and storing the read data in a second latch, wherein the third read level is larger than the first read level; and
    performing a data change operation on the first latch, wherein the data of the first latch is changed to have the high level if the data stored in the second latch has the low level; and
    outputting the data stored in the first latch.

24. The method of reading a memory according to claim 23, wherein before reading data from the target cell according to the first read level and the third read level, the method further comprises discharging all the bit lines coupled to the cells to a ground voltage.

25. The method of reading a memory according to claim 23, after the step of storing the read data in the first latch, the method further comprises:
    determining whether the target cell has been read twice, if yes, outputting data from the first latch and ending the process; and
    determining whether the upper page has been programmed and whether the lower page is to be read.

26. The method of reading a memory according to claim 25, further comprising if the upper page has been programmed and the lower page is to be read, reading data from the target cell according to a second read level, storing the read data in the first latch, and then continuing the step of storing the read data in the first latch.

27. The method of reading a memory according to claim 26, wherein before reading data from the target cell according to the second read level, the method further comprises discharging all the bit lines coupled to the cells to a ground voltage.

28. The method of reading a memory according to claim 25, further comprising if the upper page has not been programmed and the lower page is to be read, continuing the step of outputting the data stored in the first latch as the data of the lower page.

29. The method of reading a memory according to claim 25, further comprising if the upper page has not been programmed and the upper page is to be read, fixing data of the upper page to all "1" for a user.

30. The method of reading a memory according to claim 23, wherein in the step of performing the data change operation, the data of the first latch is maintained if the data stored in the second latch has the high level.

* * * * *